United States Patent [19]

Sawada

[11] Patent Number: 5,748,560
[45] Date of Patent: May 5, 1998

[54] SYNCHRONOUS SEMICONDUCTOR MEMORY DEVICE WITH AUTO PRECHARGE OPERATION EASILY CONTROLLED

[75] Inventor: Seiji Sawada, Hyogo, Japan

[73] Assignee: Mitsubishi Denki Kabushiki Kaisha, Tokyo, Japan

[21] Appl. No.: 740,175

[22] Filed: Oct. 28, 1996

[30] Foreign Application Priority Data

Dec. 25, 1995 [JP] Japan ................... 7-336783

[51] Int. Cl.⁶ ................... G11C 8/00; G11C 7/00
[52] U.S. Cl. ............... 365/233; 365/230.03; 365/230.06; 365/189.08; 365/189.12
[58] Field of Search ................. 365/233, 230.03, 365/230.06, 189.08, 189.12

[56] References Cited

U.S. PATENT DOCUMENTS 5,555,526 9/1996 Kim ........................ 365/203
5,631,871 5/1997 Park et al. ................. 365/203
5,636,173 6/1997 Schaefer ................ 365/230.03

*Primary Examiner*—David C. Nelms
*Assistant Examiner*—Trong Phan
*Attorney, Agent, or Firm*—McDermott, Will & Emery

[57] ABSTRACT

An internal read/write termination detect circuit generates a one shot pulse signal when a read operation activation signal and a write operation activation signal are both set to an inactive state. An internal operation activation signal generation circuit holds an auto precharge enable signal by a flipflop according to an auto precharge command to generate a precharge operation trigger signal according to the auto precharge enable signal and the one shot pulse signal. An internal operation activation signal is reset to an inactive state. The auto precharge command is made valid to carry out an internal precharge operation only when internal write/read operation is completed. A synchronous semiconductor memory device with easy control of an auto precharge command and reduced in layout area is provided.

11 Claims, 23 Drawing Sheets

SYNCHRONOUS SEMICONDUCTOR MEMORY DEVICE WITH AUTO PRECHARGE OPERATION EASILY CONTROLLED

BACKGROUND OF THE INVENTION

1. Field of the Invention

The present invention relates to synchronous semiconductor memory devices, and more particularly, to an architecture of an auto precharge control unit for implementing an auto precharge operation in which an internal operation is automatically terminated after application of a read command (readout operation designating signal) or a write command (write operation designating signal).

2. Description of the Background Art

FIG. 19 schematically shows an entire structure of a conventional synchronous semiconductor memory device. Referring to FIG. 19, a synchronous semiconductor memory device includes a memory cell array 1 with a plurality of memory cells arranged in a matrix, an address buffer 2 for entering an external address signal bits A <10:0> in synchronization with an externally applied periodic clock signal CLK and generating an internal address signal, row selection related circuitry 4 for selecting a row of memory cells of memory cell array 1 according to an internal row address signal bits from address buffer 2 when activated, and column selection related circuitry 6 for decoding an internal column address signal from address buffer 2 for selecting a corresponding column in memory cell array 1 when activated.

Row selection related circuitry 4 includes a decode/drive circuit for decoding an internal row address signal from address buffer 2 and driving a corresponding row in memory cell array 1 to a selected state, a sense amplifier for sensing and amplifying data of a memory cell of a selected row in memory cell array 1 (the memory cell included in memory cell array 1 is a dynamic type memory cell), and an equalize circuit for precharging each column to a predetermined potential in a standby state.

Column selection related circuitry 6 includes a column decoder for decoding an applied internal column address signal to select a memory cell of a corresponding column in memory cell array 1 when activated, and an IO gate for connecting the corresponding column of memory cell array 1 to an internal data line according to an output signal of the column decoder.

The synchronous semiconductor memory device further includes an input buffer circuit 10 for entering data DQ applied to a data input/output terminal 8 in synchronization with clock signal CLK for generating internal write data, a write circuit 12 for writing data applied from input buffer 10 to a selected memory cell of memory cell array 1 in a predetermined sequence when activated, a read circuit 14 for reading out data of selected memory cells in memory cell array 1 sequentially in a predetermined sequence in synchronization with clock signal CLK when activated, and an output buffer circuit 16 for buffering internal readout data from read circuit 14 to generate and apply to data input/output terminal 8 external output data.

Since data is written in synchronization with clock signal CLK in the synchronous semiconductor memory device, write circuit 12 includes a register for storing this data and a write driver for writing data from this register into a selected memory cell. Similarly, read circuit 14 includes a preamplifier for amplifying readout data, and a register for storing data amplified by this preamplifier and reading out the same in a predetermined sequence. The data writing and reading sequence in write circuit 12 and read circuit 14 is variable according to the operation manner.

The synchronous semiconductor memory device further includes an input buffer circuit 18 for receiving externally applied control signals, i.e. a chip select signal ZCS, a row address strobe signal ZRAS, a column address strobe signal ZCAS, a write enable signal ZWE, and an address signal bit A<10> in synchronization with clock signal CLK for generating internal control signals, a command decoder 20 for decoding an internal control signal from input buffer 18 for generating a signal designating an internal operation, a row related control circuit 22 for receiving a memory cell select operation commence designating signal ACT (internal activation designating signal) from command decoder 20, a precharge operation designating signal PC, and an auto precharge designating signal APC for controlling activation/inactivation of circuitry related to row selection, a column related control circuit 24 activated in response to a read designating signal R and a data write designating signal W from command decoder 20 for controlling the operation of components related to column selection such as activation of column selection related circuitry 6, a write control circuit 26 activated in response to data write designating signal W from command decoder 20 for driving a write operation activation signal WRITE to an active state to render write circuit 12 active, and a read control circuit 28 responsive to data read designating signal R from command decoder 20 for providing a read operation activation signal READ to read circuit 14 and data output enable signal OEM to output buffer circuit 16.

Write control circuit 26 and read control circuit 28 render internal activation signals WRITE, READ and OEM active for a predetermined time period (for the burst length described afterwards) when activated.

In FIG. 19, row related control circuit 22 is shown outputting an internal operation activation signal ACTIVE. This internal operation activation signal ACTIVE drives row selection related circuitry 4 and column selection related circuitry 6 to an active state. In response to activation of internal operation activation signal ACTIVE, a row select operation (word line select operation) is initiated in memory cell array 1 in the synchronous semiconductor memory device. The synchronous semiconductor memory device is rendered active internally, i.e. memory cell array 1 is set to a selected state, during the activate period of internal operation activation signal ACTIVE. This signal ACTIVE is rendered inactive by activation of precharge designating signal PC or APC.

In the synchronous semiconductor memory device, external control signals and address signals are entered in synchronization with clock signal CLK. An internal operation is designated according to the states of external control signals and a particular address signal bit A<10> at the rise of clock signal CLK. It is therefore not necessary to account for margin of the skew of the external control signals and address signals (since the state of each external control signal and address signal is identified at the rise of a clock signal), and an internal operation can be initiated at high speed. Furthermore, data can be input/output speedily since data input/output is carried out in synchronization with clock signal CLK.

FIG. 20 shows an example of a structure of input buffer circuit 18 and command decoder 20. FIG. 20 illustrates only the portion for generating auto precharge operation designating signal APC. In an auto precharge operation, inactivation of signal ACTIVE, i.e. precharge, is carried out internally at an elapse of a predetermined time period automatically. Referring to FIG. 20, input buffer circuit 18 includes an inverter 18a receiving an external chip select signal ZCS, a NAND circuit 18b for receiving an output signal of inverter 18a and clock signal CLK, and a pulse generation circuit 18c responsive to a fall of an output signal of NAND circuit 18b for generating a one shot pulse for a predetermined time period.

A set of inverter 18a, NAND circuit 18b and pulse generation circuit 18c is provided corresponding to each of external control signals ZCAS, ZRAS, ZWE and address signal bit A<10>. When external chip select signal ZCS is set to an L level (logical low) at a rise of clock signal CLK, the output signal of NAND circuit 18b is pulled down to an L level, and a one shot pulse signal CSO of an H level (logical high) is output from pulse generation circuit 18c.

Command decoder 20 includes an auto precharge command decode circuit 20a formed of an AND circuit receiving internal control signals CSO, CASO, and ZA<10> from input buffer circuit 18. Internal control signal CASO is set to an H level for a predetermined time period when external column address strobe signal ZCAS is set to an L level at a rise of clock signal CLK. Internal address signal bit ZA<10> is pulled up to an H level when address signal bit A<10> is set to an H level at a rise of clock signal CLK. Auto precharge command decode circuit 20a renders auto precharge operation designating signal APC to an active state of an H level when all the applied internal control signals attain an H level. Since an internal operation is set according to the status combination of external control signals at the rise of a clock signal, the combination of the states of an external control signals and an address signal bit A<10> is referred to as a command.

FIG. 21 shows a structure of the portion for generating internal operation activation signal ACTIVE in row related control circuit 22 in FIG. 19. During activation of this internal operation activation signal ACTIVE, the memory cell array in the synchronous semiconductor memory device is set to a selected state.

Referring to FIG. 21, row related control circuit 22 includes a shifter circuit 22a for shifting auto precharge operation designating signal APC for a predetermined time period in synchronization with clock signal CLK, an OR circuit 22b for receiving precharge operation designating signal PC rendered active in response to an externally applied precharge command and an auto precharge trigger signal PC2 output from shifter circuit 22a, and a flipflop 22c set in response to internal activation operation commence designation signal (internal operation activation designating signal) ACT rendered active at an H level for a predetermined time in response to an externally applied active command ACT and reset in response to an output signal of OR circuit 22b. Internal operation activation signal ACTIVE is provided from an output O of flipflop 22c.

Precharge command PC is applied for terminating an active (selected) state of the memory cell array in the synchronous semiconductor memory device. An auto precharge command is provided simultaneously with a read command indicating data readout or a write command indicating data writing, and enters the internal state of the synchronous semiconductor memory device to a precharge state (inactive state) at an elapse of a predetermined clock cycle after this read command or a write command is applied.

More specifically, as shown in FIG. 21, internal activation signal ACTIVE rendered active in response to activation of internal operation activation designating signal ACT is reset due to auto precharge trigger signal PC2 driven to an H level at an elapse of a delay time (number of shift clock cycles) of shifter circuit 22a when an auto precharge command is applied. The memory array is automatically set to a de-selected state (inactive state) internally.

FIG. 22A shows a structure of a write operation activation signal generation portion of write control circuit 26 of FIG. 19. Referring to FIG. 22A, write control circuit 26 includes a burst length counter 26a for delaying for a predetermined number of cycles of clock signal CLK internal write operation designating signal W rendered active of an H level for a predetermined time in response to write command, and a flipflop 26b set in response to activation of internal write operation designating signal W and reset in response to activation of an output signal from burst length counter 26a. Write activation signal WRITE is provided from output O of flipflop 26b.

Burst length counter 26a counts the number of clock cycles corresponding to the number of data (burst length) that can continuously be written at the application of one write command. When the count value becomes equal to a preset burst length, burst length counter 26a provides a count up signal. Therefore, internal write control signal WRITE is set to an active state of an H level for a clock cycle time period corresponding to the burst length since activation of write operation designating signal W.

FIG. 22B shows a structure of the portion for generating activation signal READ and OEM of read control circuit 28 of FIG. 19. Referring to FIG. 22B, read control circuit 28 includes a burst length counter 28a started in response to activation of read operation designating signal R for counting the number of clock cycles corresponding to a preset burst length with respect to a read operation, a flipflop 28b set in response to activation of read operation designating signal R and reset in response to a count up signal from burst length counter 28a, and a clock shift circuit 28c for shifting an output signal from output O of flipflop 28b for a predetermined time in synchronization with clock signal CLK.

Read operation designating signal R is rendered active at an H level for a predetermined time when a read command is applied. Read operation activation signal READ is output from output O of flipflop 28b. Clock shift circuit 28c delays this read operation activation signal READ by the period called CAS latency by a clock shift operation to output a data output enable signal OEM. Therefore, read circuit 14 and output buffer circuit 16 shown in FIG. 19 have different activation periods. CAS latency is provided to cope with the time required for reading out data of a selected memory cell in memory cell array 1 and providing the same to output buffer circuit 16 when a read command is applied.

The structure of the internal operation control signal generation unit shown in FIGS. 20, 21, 22A and 22B will now be described with reference to the timing chart of FIG. 23.

At clock cycle #0, the synchronous semiconductor memory device attains a precharge state, and all internal signals attain an inactive state of an L level (precharge state).

At clock cycle #1, external control signals ZCS, ZRAS, ZCAS and ZWE are set to respective predetermined states at the rise of clock signal CLK, and an active command is applied. In response to this active command, internal activation designating signal ACT is output from an active command decode circuit (not shown) in the command decoder. In response to activation of internal operation activation designating signal ACT, flipflop 22c of FIG. 21 is set, and internal operation activation signal ACTIVE is driven to an active state of an H level. In response to activation of internal operation activation signal ACTIVE, row selection related circuitry 4 of FIG. 19 is rendered active, and a corresponding memory cell in memory cell array 1 is selected according to an address signal from address buffer 2.

At clock cycle #5, a read command and an auto precharge command are applied. The setting of this auto precharge command will be described afterwards. In response to this read command, an internal read operation designating signal R from command decoder 20 is rendered active at an H level, whereby flipflop 28b shown in FIG. 22B is set and read operation activation signal READ is rendered active. In response to activation of read operation activation signal READ, read circuit 14 is activated, whereby column related control circuit 24 (FIG. 19) drives column selection related circuitry 6 to an active state to select a column in memory cell array 1 according to the read command. Data of a memory cell selected by column selection related circuitry 6 is read out by read circuit 14. Burst length counter 28a is started in response to activation of read operation designating signal R to count the number of clock cycles of a predetermined burst length.

According to an auto precharge command, auto precharge operation designating signal APC is activated, and shifter circuit 22a shifts auto precharge operation designating signal APC in synchronization with clock signal CLK. It is assumed that the number of shift clocks of shifter circuit 22a is identical to the number of clock cycles of the burst length of burst length counter 28a, which is four clock cycles. In this case, at clock cycle #9, auto precharge operation trigger signal PC2 from shifter circuit 22a is driven to an H level, and the output signal of OR circuit 22b is driven to an H level. As a result, flipflop 22c is reset, whereby internal operation activation signal ACTIVE is rendered inactive at an L level.

The burst length is 4. Data is sequentially read out from clock cycle #6 to be provided to output buffer circuit 16. Output buffer circuit 16 is rendered active in response to data output enable signal OEM to sequentially output data provided from read circuit 16. Assuming that the CAS latency is 3, i.e. the number of shift clock cycles of clock shift circuit 28c shown in FIG. 22B is 3, data output enable signal OEM is driven to an H level at clock cycle #7, and data is sequentially output from clock cycle #8. Even when read operation activation signal READ is rendered inactive at clock cycle #9, only read circuit 14 is inactivated, and previously readout data are sequentially output via output buffer circuit 16. Output buffer circuit 14 provides four data in synchronization with clock signal CLK. Therefore, by one read command, four data can be continuously read out in synchronization with clock signal CLK. Furthermore, a precharge operation is automatically carried out internally.

A page mode operation will now be considered. More specifically, data more than a burst length of one row of memory cells are successively read out. In this case, a read command is supplied at clock cycle #9, whereby read operation designating signal R is rendered active. However, internal activation signal ACTIVE is rendered inactive according to activation of auto precharge operation trigger signal PC2 and memory cell array 1 is returned to a precharge state. Therefore, even when a read command is applied and read circuit 14 and output buffer circuit 16 are rendered active again to implement a data readout operation at clock cycle #9, column selection related circuitry 6 attains an inactive state (operation of column selection related circuitry 6 is not affected when internal operation activation signal ACTIVE is inactive). Therefore, proper read out of data cannot be carried out.

Furthermore, even when write operation activation signal WRITE attains an active state of an H level in response to activation of internal write operation designating signal W to an H level for a predetermined time H by application of a write command at clock cycles #13 and #17, memory array 1 attains a precharge state according to inactivation of internal activation signal ACTIVE, so that data writing is not carried out. When an auto precharge command is used, the memory cell array is inactivated (precharged) automatically, after a read operation or a write operation is carried out. Therefore, a clock cycle for applying a precharge command is not required (this command is applied simultaneously with a read command or a write command), and that clock cycle can be used for entering another command.

When an auto precharge command is used, data is not read out even when a read command is applied (activation signals READ and OEM are rendered active) at clock cycle #9 shown in FIG. 23 since a precharge operation of the memory cell array is carried out automatically inside. Similarly, even when a write command is applied at clock cycles #13 and #17 and write circuit 12 is rendered active in response to write activation signal WRITE, column selection related circuitry 6 attains an inactive state, so that data writing to a memory cell is not carried out.

FIGS. 24A and 24B show the state of external signals during data readout and data writing. The symbol "Ext" is used to indicate an external signal.

Referring to FIG. 24A, an active command is applied at clock cycle #0. This active command is provided by driving external chip select signal ExtZCS and external row address strobe signal ExtZRAS to an L level, and external column address strobe signal ExtZCAS and external write enable signal ExtZWE to an H level. External address signal bits ExtA <0-9> and external address signal bit ExtA<10> at application of this active command are entered as a row address signal X. According to this active command, internal operation activation signal ACTIVE is rendered active at an H level.

At clock cycle #3, a read command and an auto precharge command are applied. This read command is provided by driving external control signal ExtZCS and ExtZCAS to an L level, and external control signals ExtZRAS and ExtZWE to an H level. Also, external address signal bit ExtA<10> is driven to an H level. Here, address signal bits ExtA <0-9> are entered as a column address signal Y. In other words, a row address signal is 11 bits in width and a column address signal is 10 bits in width in this synchronous semiconductor memory device. Since the number of bits differ between the column address signal and the row address signal, address signal bit ExtA<10> which attains a free state when a read command or a write command is applied is used as an auto precharge command.

According to this read command, data is sequentially output from clock cycle #6 in synchronization with clock signal CLK at an elapse of a CAS latency (in FIG. 24A, CAS latency is 3). According to an auto precharge command, following the internal counting of four clock cycles (a number of clock cycles identical to the burst length), internal operation activation signal ACTIVE is rendered inactive at an L level at clock cycle #7.

Even if a read command is applied again at clock cycle #7 (since auto precharge command is not applied, address signal bit Ext<10> is set to an L level in this clock cycle), data corresponding to this read command applied at clock cycle #7 is not read out since internal operation activation signal ACTIVE is rendered inactive. In other words, only data Q0–Q3 read out by the first read command are output.

As described above, data cannot be read out by a read command subsequent to application of an auto precharge command. It is therefore necessary to apply the auto precharge command simultaneously with the last applied read command of the page in a page mode operation. Therefore, in a page mode operation, external address signal bit ExtA<10> must be set to an L level during a page mode operation and then set to an H level with respect to the last command of the page to apply an auto precharge command. This control of an load of access control of an external control device since the external control device must always identify whether the page mode operation is at its end or not in a page mode during accessing the synchronous semiconductor memory device. There is also a problem that data cannot be read out continuously at all after an auto precharge command is accidentally applied due to some cause such as noise. A data writing operation will now be described.

Referring to FIG. 24B, an active command is applied at clock cycle #0 to set internal operation activation signal ACTIVE to an active state of an H level, whereby a memory cell select operation is carried out. At clock cycle #3, a write command and an auto precharge command are applied. A write command is applied by setting external control signals ExtZCS, ExtZCAS, and ExtZWE to an L level, and external row address strobe signal ExtZRAS to an H level. Here, address signal bit ExtA<10> is set to an H level. Data D0–D3 is sequentially written from clock cycle #3 where this write command is applied. According to the auto precharge command, internal operation activation signal ACTIVE is set to an inactive state of an L level at clock cycle #7 at the elapse of four clock cycles. Internal data writing is effected 1 clock cycle behind. Therefore, even if a write command is applied again at clock cycle #7 (auto precharge command is not applied), write data to be written by the write command applied at this clock cycle #7 will not be written into the memory cell array since the memory cell array has already returned to a precharge state and column selection related circuitry 6 is rendered inactive. Thus, an auto precharge command must be applied simultaneously with the last command of the page during data writing in a page mode operation.

In an auto precharge operation in a conventional synchronous semiconductor memory device, determination of whether it is a page mode operation or not, and determination of whether it is the end of the page must be carried out for each command, resulting in increase in the load of the external control device.

FIG. 25 shows another structure of a conventional synchronous semiconductor memory device. In the synchronous semiconductor memory device of FIG. 25, banks #A and #B are provided which are driven to active states independently of each other. Each of banks #A and #B includes row selection related circuitry 4, column selection related circuitry 6, write circuit 12 and read circuit 14 already shown in FIG. 19. In general, input buffer circuit 10 and output buffer circuit 16 are provided in common to banks #A and #B.

For the purpose of driving banks #A and #B independently of each other, control circuits 32a and 32b are provided which are selectively activated in response to bank address signals BA and ZBA provided from a bank address buffer 30 for executing a required control operation on corresponding bank #A and bank #B according to an internal operation designating signal provided from command decoder 20. Bank address buffer 30 receives an externally applied bank address signal ExtBA in synchronization with clock signal CLK to generate internal bank address signals BA and ZBA. Command decoder 20 has a structure similar to that shown in FIG. 19. Also, control circuits 32a and 32b have the same structure and include each control circuit shown in FIG. 19. As shown in FIG. 25, banks #A and #B can be accessed alternately by driving by control circuits 32a and 32b independent of each other. More specifically, one bank is rendered active during the access operation of the other bank, and the one bank is accessed continuously at the completion of access to the other bank, so that synchronous semiconductor memory device can be accessed in succession.

FIG. 26 schematically shows a structure of an auto precharge operation designating signal activation portion included in control circuits 32a and 32b shown in FIG. 25. In FIG. 26, a complementary bank address signal ZBA is generated by inverting bank address signal BA by inverter 33. Control circuit 32a includes an AND circuit 32aa receiving complementary bank address signal ZBA and auto precharge operation designating signal APC provided from command decoder 20, and a shifter circuit 32ab for shifting an output signal of AND circuit 32aa in synchronization with clock signal CLK. An auto precharge operation trigger signal PC2(A) with respect to bank #A is provided from shifter circuit 32ab. Auto precharge operation trigger circuit PC2(A) from shifter circuit 32ab is provided to row related control circuit 32ac. Internal operation activation signal ACTIVE(A) that activates the internal operation for bank #A is provided from this row related control circuit 32ac.

Control circuit 32b includes an AND circuit 32ba receiving auto precharge operation designating signal APC and bank address signal BA, and a shifter circuit 32bb for shifting an output signal of AND circuit 32ba in synchronization with clock signal CLK. An auto precharge operation trigger signal PC2(B) for bank #B is output from shifter circuit 32bb. Auto precharge operation trigger signal PC2(B) is applied to a row related control circuit 32bc for controlling the operation of the portion related to the row select operation of bank #B. An internal operation activation signal ACTIVE(B) for commencing a memory cell select operation in bank #B is provided from row related control circuit 32bc. The operation of the synchronous semiconductor memory device shown in FIGS. 25 and 26 will now be described with reference to the timing chart of FIG. 27.

At clock cycle #0, an active command is provided, and bank address signal BA is set to 0 to designate bank #A. In response to this active command and bank address signal BA, row related control circuit 32ac in control circuit 32a is activated, whereby internal operation activation signal ACTIVE(A) for commencing a memory cell select operation for bank #A is rendered active.

At clock cycle #2, an active command is applied, and bank address signal BA is set to an H level to designate bank #B. In response to this active command and bank address signal BA, internal operation activation designating signal ACT(B) is activated, whereby row related control circuit 32bc for bank #B is rendered active, and internal activation signal ACTIVE(B) for commencing a memory cell select operation of bank#B is rendered active. Therefore, banks #A and #B are both rendered active from clock cycle #2. In response to activation of internal operation activation signals ACTIVE(A) and ACTIVE(B), a memory cell select operation is carried out in each of banks #A and #B.

At clock cycle #5, an auto precharge command and a read command or a write command are applied. The read command and the write command will be referred to as access (or read/write) command hereinafter. Here, bank address signal BA is set to an L level to designate bank #A. Therefore, in bank #A, an access (read or write) operation activation signal is rendered active. It is now assumed that shifted circuit 32ab shifts an applied signal for two clock cycles. In this case, shifter circuit 32ab responds to auto precharge operation designating signal APC from clock cycle #5 to render auto precharge operation trigger signal PC2(A) to an active state of an H level at clock cycle #7 at the elapse of two clock cycles. In response to activation of auto precharge operation trigger signal PC2(A), row related control circuit 32ac renders internal operation activation signal ACTIVE(A) to an L level of an inactive state. Here, bank #B still maintains an active state. At clock cycle #10, an auto precharge command and read/write command (access command) are provided again. Here, bank address signal BA is set to an H level and bank #B is designated. In response to this read/write command (access command), a data access operation for a selected memory cell is effected in bank #B. Shifter circuit 32bb is rendered active in response to an auto precharge command to shift auto precharge operation designating signal APC, and renders auto precharge operation trigger signal PC2(B) to an H level at clock cycle #12 corresponding to elapse of two clock cycles. In response to activation of auto precharge operation trigger signal PC2(B), internal activation signal ACTIVE(B) for bank #B is rendered inactive.

The data access operation shown in FIG. 27 has a burst length of 2. By activating banks #A and #B alternately, data can be accessed more speedily than the operation sequence in which an active command for one bank is applied after completion of access to the other bank.

According to this bank architecture, shifter circuits 32ab and 32bb are individually provided in control circuits 32a and 32b to drive each of banks #A and #B independently of the other for effecting an auto precharge operation. Shifter circuits 32ab and 32bb have the same structure, and shift an applied signal in synchronization with clock signal CLK. Therefore, the occupying area of circuitry is relatively great (the number of components is great), resulting in a problem that the layout area of control circuits 32a and 32b is increased.

SUMMARY OF THE INVENTION

An object of the present invention is to provide a synchronous semiconductor memory device that can properly accurately required data even when an auto precharge command is applied at an arbitrary time point.

Another object of the present invention is to provide a synchronous semiconductor memory device of a bank architecture having an auto precharge operation control portion reduced in occupying area.

A further object of the present invention is to provide a synchronous semiconductor memory device of a bank architecture reduced in layout area and allowing access to all required data even if an auto precharge command is applied at an arbitrary time point.

A synchronous semiconductor memory device according to an aspect of the present invention includes an internal activation signal generation circuit responsive to an externally applied memory cell select operation commence designating signal for rendering an internal operation activation signal active, an access operation activation signal generation circuit responsive to an externally applied access designating signal for rendering an internal access operation activation signal active, a precharge activation signal generation circuit responsive to a precharge designating signal applied simultaneously with an access designating signal for rendering an internal precharge activation signal active, and an internal operation inactivation circuit responsive to inactivation of an access operation activation signal and an activated internal precharge activation signal for rendering an internal operation activation signal inactive.

A synchronous semiconductor memory device according to another aspect of the present invention includes a plurality of banks, each having a plurality of memory cells and driven to an active state independently of each other, an internal operation designating circuit responsive to an externally applied memory cell select operation designating signal and a first bank address signal specifying one of a plurality of banks for activating an internal operation designating signal for the bank specified by the first bank address signal, an internal access activation circuit responsive to an externally applied access designating signal and a second bank address signal for activating an internal access operation activation signal for a bank specified by the second bank address signal, a precharge designating circuit responsive to a precharge designating signal applied simultaneously to the access designating signal for rendering active an internal precharge designating signal for a bank specified by the second bank address signal, a plurality of internal access operation activation circuits provided corresponding to each of the plurality of banks, each responsive to an internal operation designating signal provided from the internal operation designating circuit for activating an internal access operation activation signal that renders active a corresponding bank, and precharge circuits provided corresponding to the plurality of banks, each precharge circuit receiving a corresponding precharge designating signal from the precharge designating circuit and internal access activation signals for corresponding and other banks from the internal access activation circuits for inactivating an internal operation activation signal for a corresponding bank in response to one of activation of an internal access activation signal for the other bank and inactivation of the corresponding internal access operation activation signal, and activation of the precharge designating signal.

By rendering an internal operation activation signal to an inactive state when internal read and write operations are both inactive and the precharge designating signal is active, the precharge operation according to an applied auto precharge command is inhibited until the writing or reading operation for all the required data is completed. Thus, the timing of applying an auto precharge command can be set to an arbitrary timing to relax the load of an external control circuit.

By providing the precharge designating circuit in common to a plurality of banks, a count circuit for delaying the auto precharge designating signal for a predetermined time period can be commonly shared by the plurality of banks to reduce the layout area of the control portion. By receiving a precharge designating signal from the precharge designating circuit, an internal access operation activation signal, and an internal access operation activation signal for another bank from the internal access activation circuit in each of the plurality of banks, to inactivate the active control signal of a corresponding bank according to one of activation of the internal access activation signal for another bank and inactivation of the internal access operation activation signal and activation of the precharge designating signal, writing/ reading of required data can be effected properly even when an auto precharge command is applied in an arbitrary sequence for each bank.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
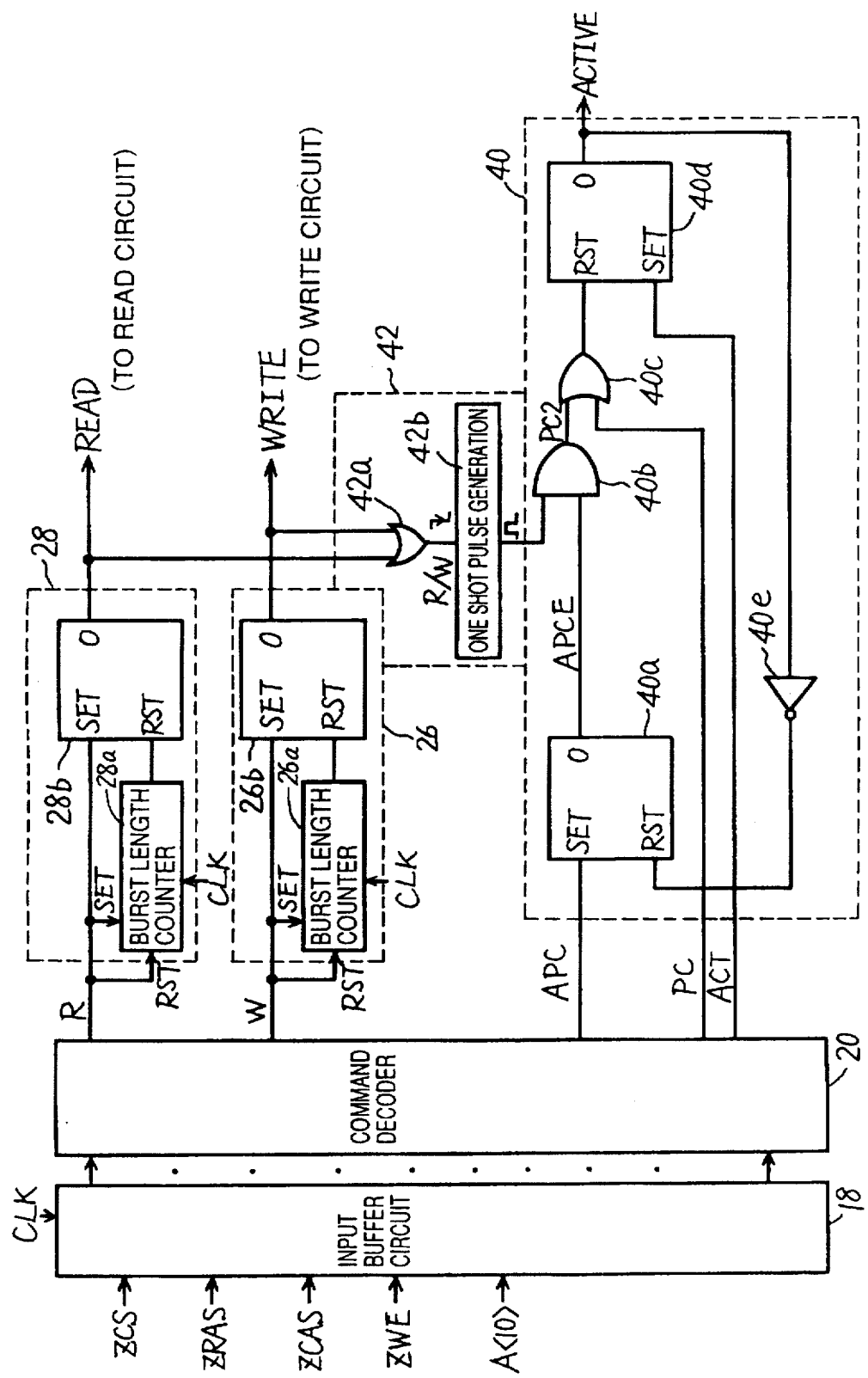
FIG. 1 shows a structure of the main part of a synchronous semiconductor memory device according to a first embodiment of the present invention.

Referring to FIG. 1, a synchronous semiconductor memory device according to a first embodiment of the present invention includes an input buffer circuit 18 for incorporating external control signals ZCS, ZRAS, ZCAS and ZWE and an address signal bit A<10> in synchronization with a clock signal CLK for generating an internal control signal, and a command decoder 20 for decoding internal control signals from input buffer circuit 18 to generate a designating signal (trigger signal) for activating a specified internal operation, both similar to conventional ones. The structures of input buffer circuit 18 and command decoder 20 are similar to those in a conventional synchronous semiconductor memory device.

Figure 19:
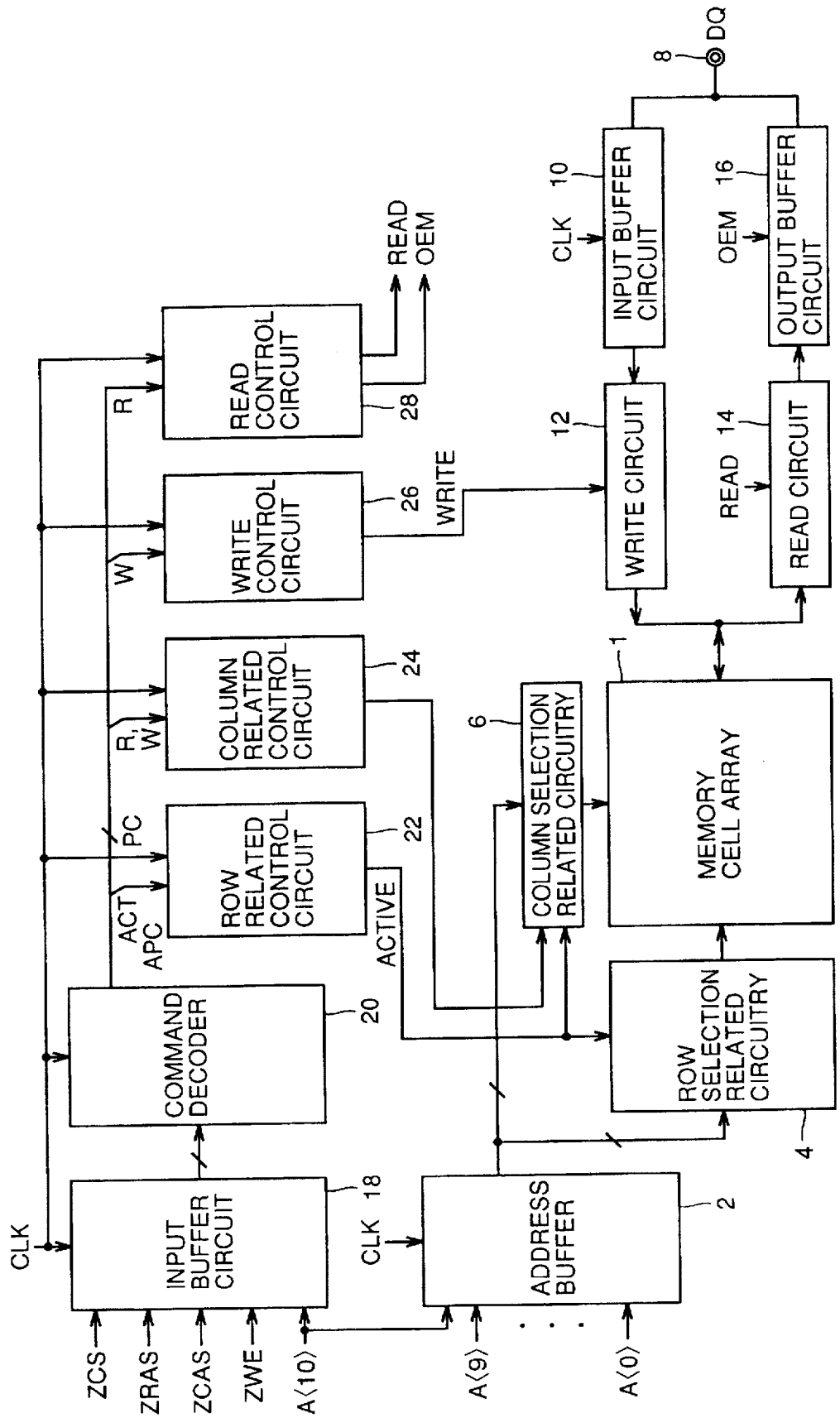
FIG. 19 schematically shows a structure of a conventional synchronous semiconductor memory device.
Figure 20:
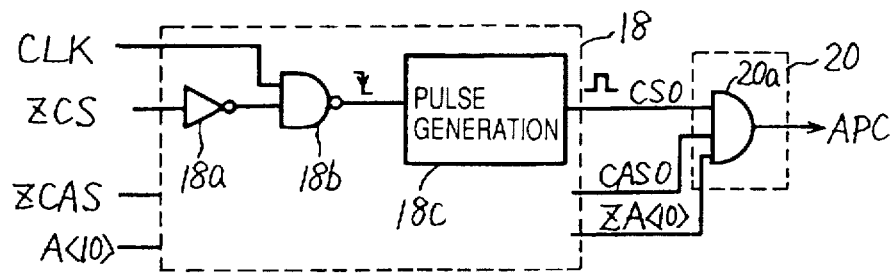
FIG. 20 shows a structure of an input buffer circuit and a command decoder of FIG. 19.
Figure 21:
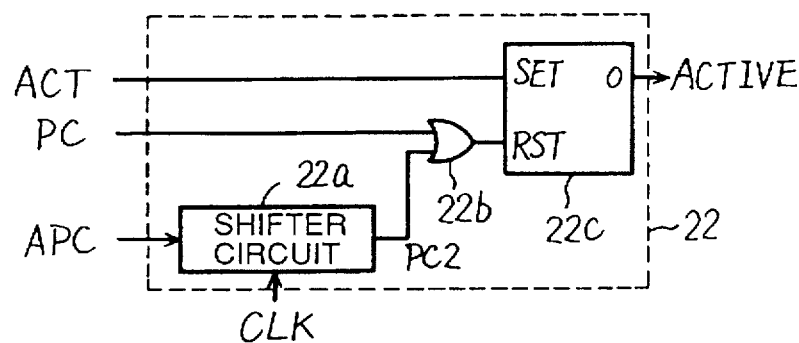
FIG. 21 shows a structure of a row related control circuit of FIG. 19.
Figure 22A:
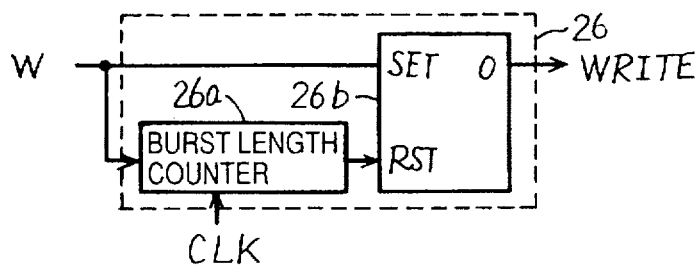
FIGS. 22A and 22B schematically show a structure of a write control circuit and a read control circuit, respectively, of FIG. 19.
Figure 22B:
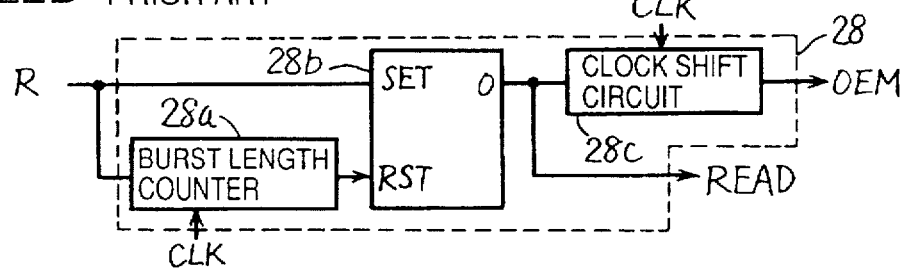
Figure 23:
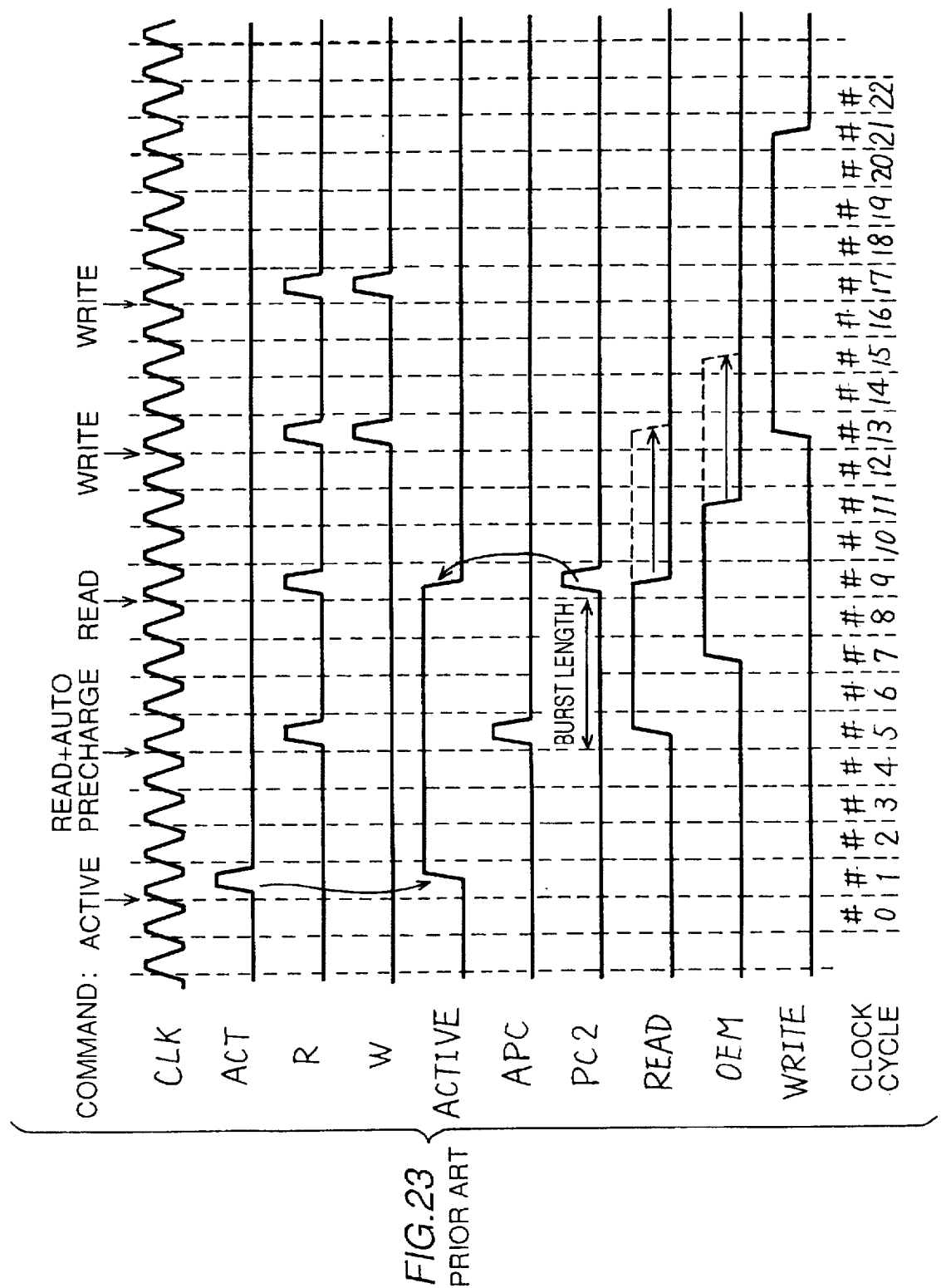
FIG. 23 is a timing chart representing an operation of a conventional synchronous semiconductor memory device.
Figure 24A:
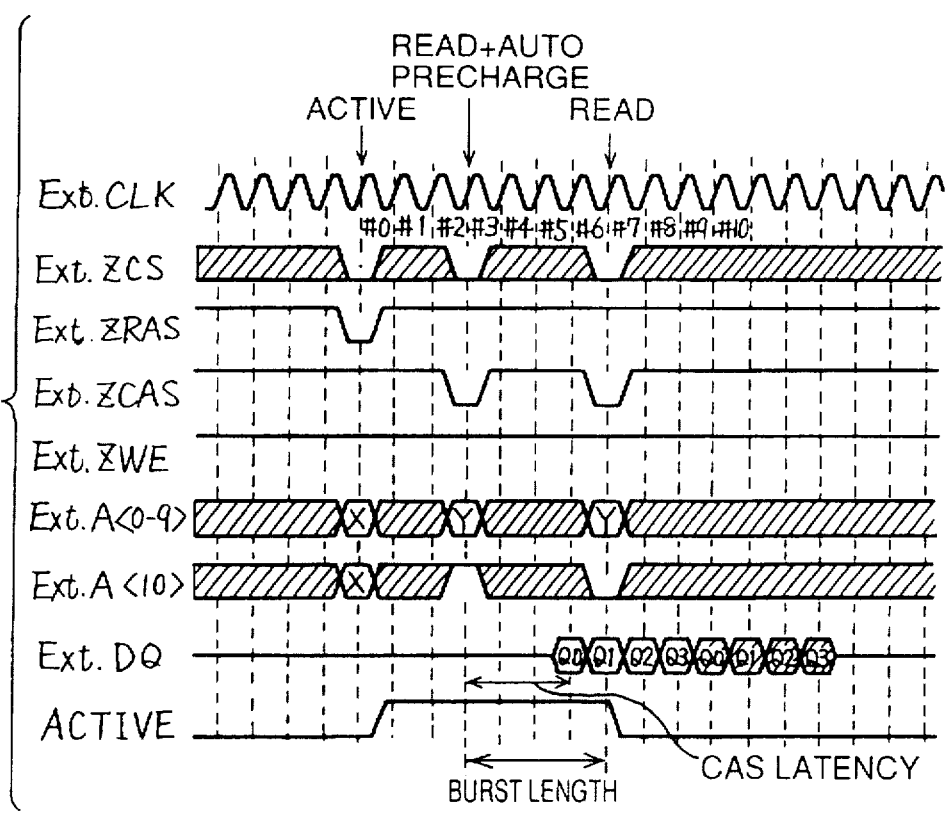
FIGS. 24A and 24B are timing charts showing states of external signals in accessing the conventional synchronous semiconductor memory device.
Figure 24B:
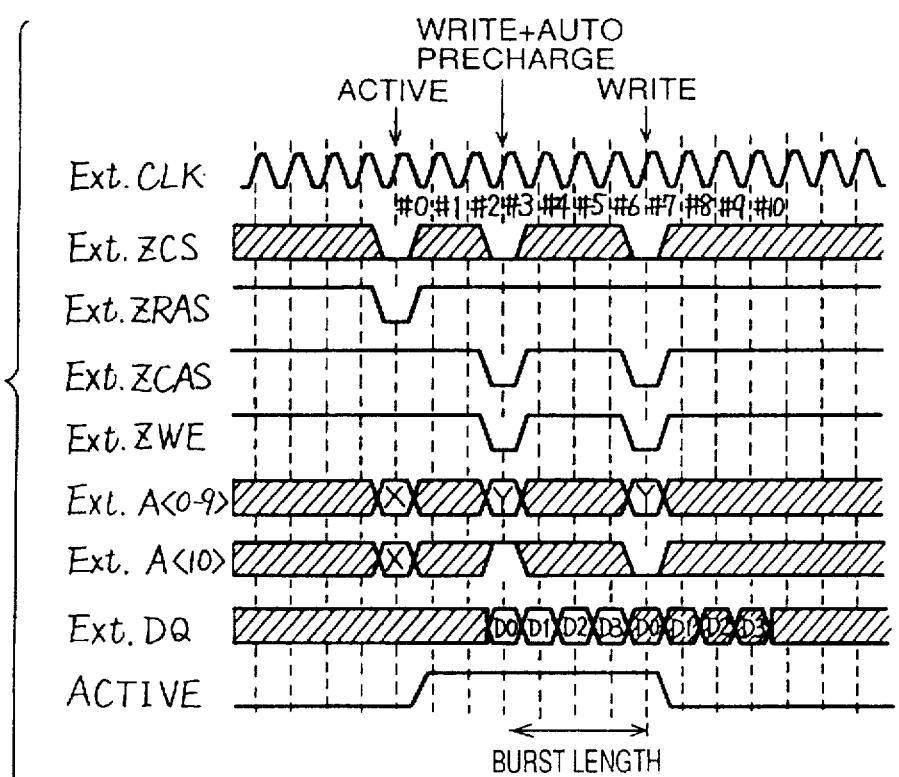
Figure 25:
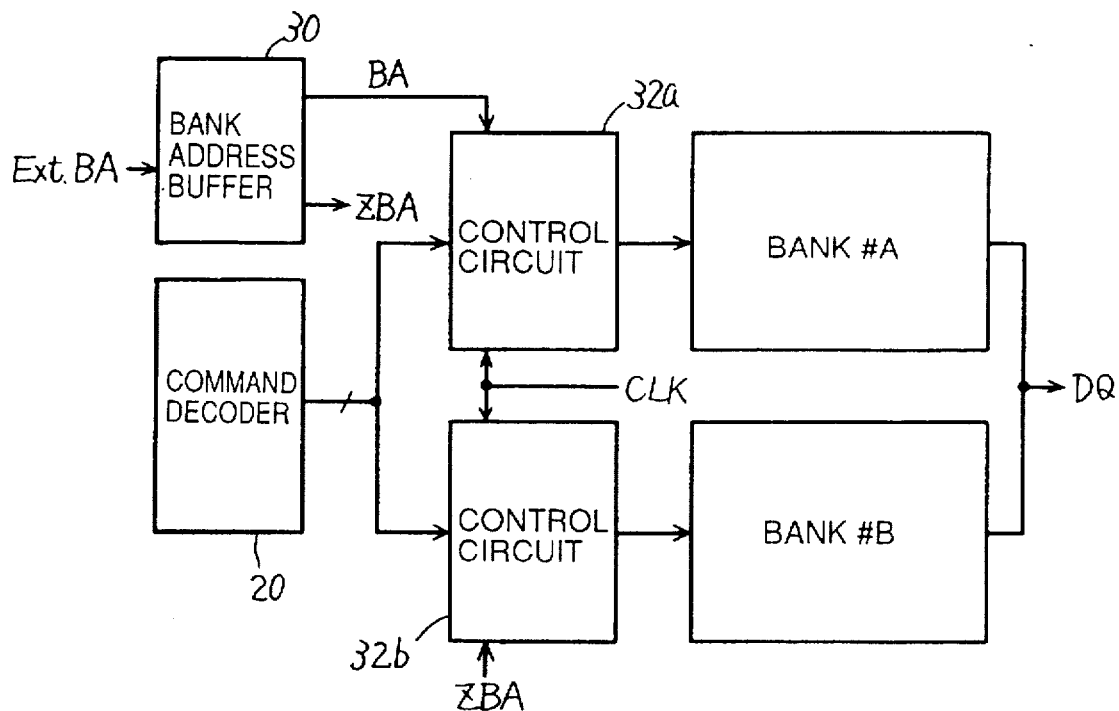
FIG. 25 shows another structure of a conventional synchronous semiconductor memory device.
Figure 26:
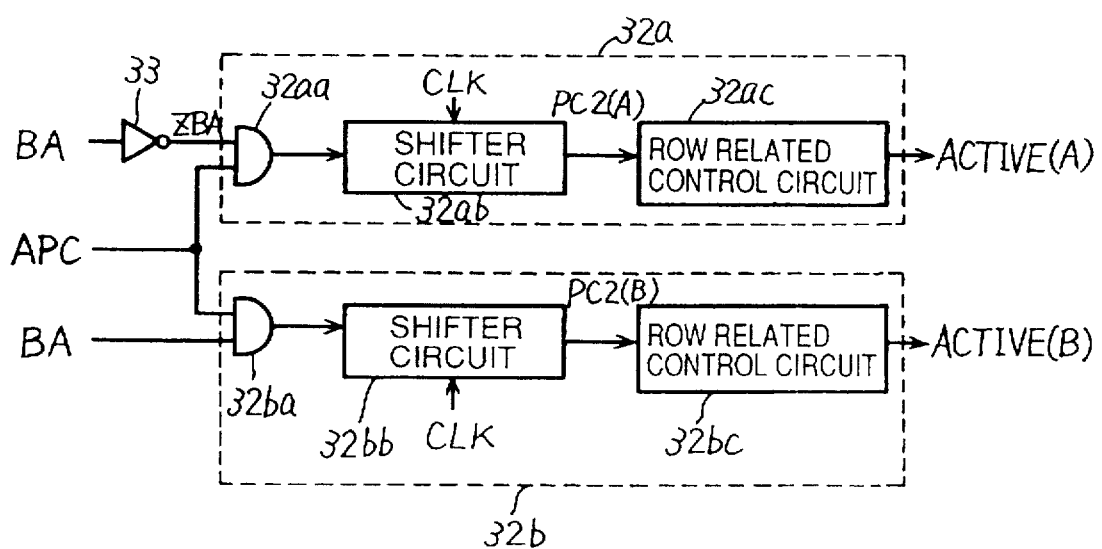
FIG. 26 schematically shows a structure of a control circuit shown in FIG. 26.
Figure 27:
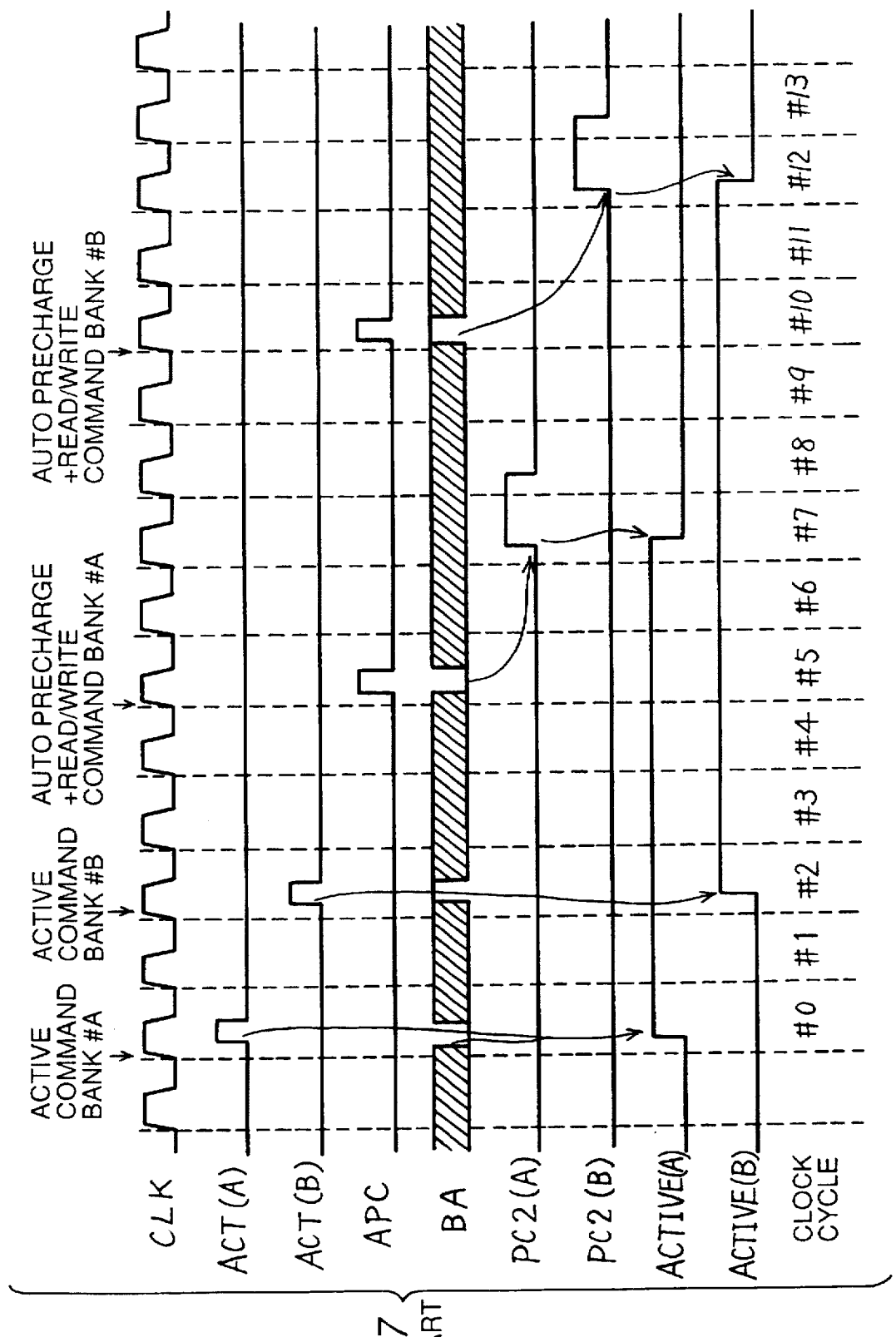
FIG. 27 is a timing chart representing an operation of the control circuit shown in FIG. 26.

The synchronous semiconductor memory device further includes a read control circuit 28 responsive to activation of a read operation designating signal R from command decoder 20 for providing a read operation activation signal READ rendered active for a predetermined time period, and a write control circuit 26 responsive to activation of a write operation designating signal W from command decoder 20 for providing a write operation activation signal WRITE rendered active for a predetermined time period. Read operation activation signal READ is applied to a read circuit (refer to FIG. 19), and write operation activation signal WRITE is applied to a write circuit (refer to FIG. 19). Although not shown in FIG. 1, read control circuit 28 further includes a portion for delaying read operation activation signal READ for a predetermined time period (CAS latency) and generating a data output enable signal OEM.

Write control circuit 26 includes a burst length counter 26a started when write operation designating signal W is activated for counting clock signal CLK for a predetermined time period (burst length), and a flipflop 26b set at activation of write operation designating signal W and reset in response to a count up signal of burst length counter 26a. Write operation activation signal WRITE is provided from flipflop 26b. Burst length counter 26a responds to activation of write operation designating signal W to have the count value reset to an initial value and to initiate a count operation.

Read operation control circuit 28 includes a burst length counter 28a started in response to activation of read operation designating signal R for counting clock signal CLK for a predetermined time period (the number of clock cycles corresponding to the burst length), and a flipflop 28b set in response to activation of read operation designating signal R and reset in response to a count up signal of burst length counter 28a. Read operation activation signal READ is provided from flipflop 28b. Similar to burst length counter 26a, burst length counter 28a has the count value reset to its initial value to initiate a count operation in response to activation of read operation designating signal R.

The synchronous semiconductor memory device further includes an internal operation completion detection circuit 42 responsive to inactivation of both read operation activation signal READ and WRITE operation activation signal WRITE for detecting completion of an internal access operation of the synchronous semiconductor memory device. Internal operation completion detection circuit 42 includes an OR circuit 42a for receiving read operation activation signal READ and write operation activation signal WRITE, and one shot pulse generator 42b responsive to a fall of an output signal of OR circuit 42a for generating a pulse signal attaining an H level for a predetermined time period.

The synchronous semiconductor memory device further includes a row related control circuit 40 responsive to activation of internal operation activation designating signal ACT from command decoder 20 for rendering internal operation activation signal ACTIVE to an active state. Internal operation activation signal ACTIVE is reset to attain an inactive state in response to activation of precharge operation designating signal PC or activation of auto precharge operation designating signal APC and of an internal operation completion detection signal from internal operation completion detection circuit 42.

Row related control circuit 40 includes a flipflop 40a set in response to auto precharge operation designating signal APC from command decoder 20 for providing an auto precharge operation enable signal APCE, an AND circuit 40b for receiving auto precharge operation enable signal APCE and the detection signal from internal operation completion detection circuit 42, an OR circuit 40c for receiving an output signal PC2 of AND circuit 40b and precharge operation designating signal PC, and a flipflop 40d set in response to activation of internal operation activation designating signal ACT from command decoder 20, and reset in response to activation of an output signal of OR circuit 40c.

Internal operation activation signal ACTIVE is provided from flipflop 40d. During the active period of internal operation activation signal ACTIVE, the synchronous semiconductor memory device attains a selected state, and the memory cell array is driven to a selected state. More specifically, in response to activation of internal operation activation signal ACTIVE, a row select operation of a memory cell in t he memory cell array is effected, and sensing, amplification, and latching of data of a memory cell on a selected row is carried out by a sense amplifier not shown. When an access command of a read command or a write command is applied, the column selection related circuitry is activated, whereby a memory cell is selected from the memory cells of the selected row to effect data writing or reading.

Figure 2:
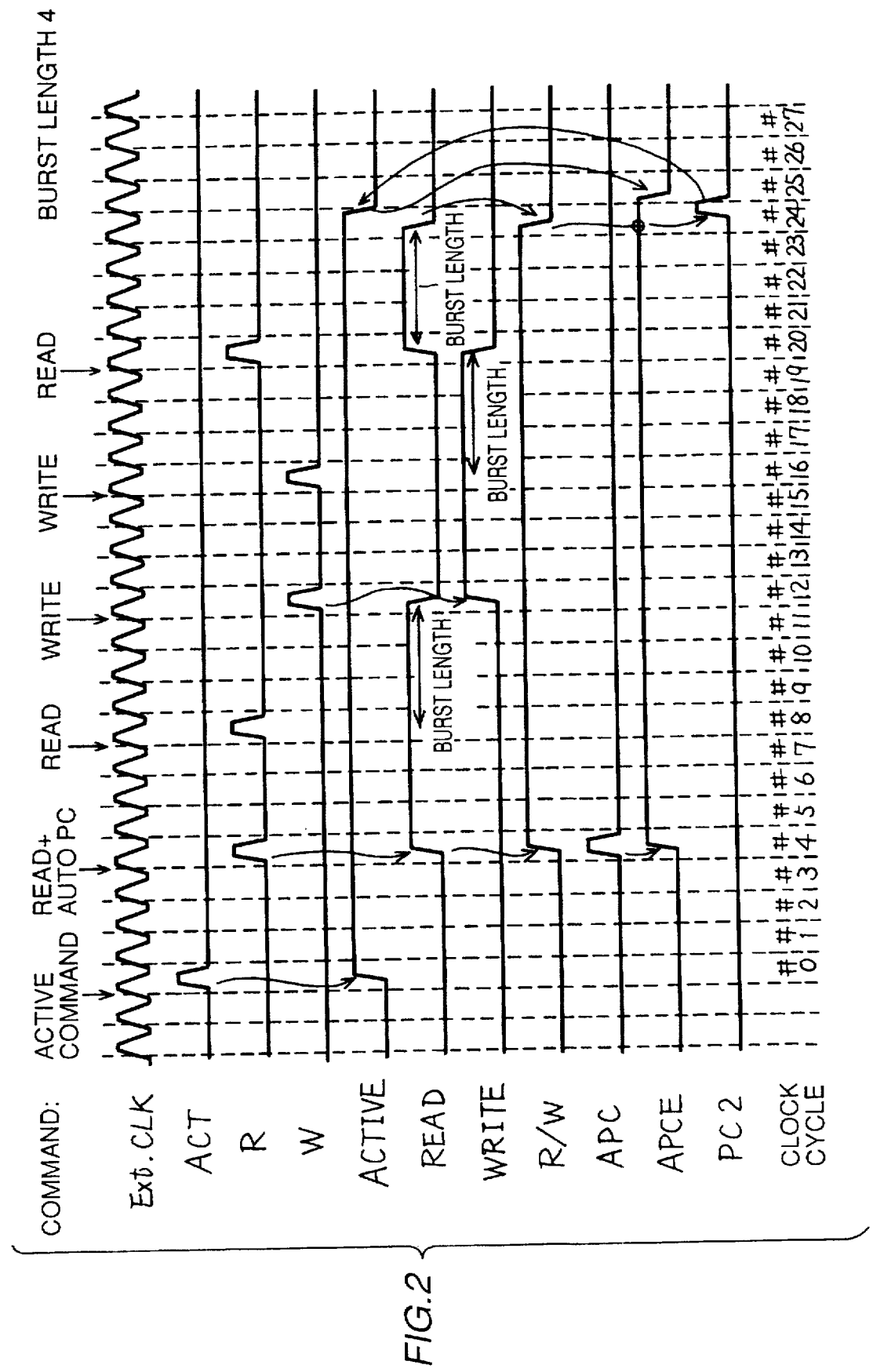
FIG. 2 is a timing chart representing an operation of the synchronous semiconductor memory device of FIG. 1.

Internal operation activation signal ACTIVE is applied to a reset input RST of flipflop 40a via inverter 40e. Therefore, flipflop 40a is reset in response to inactivation of internal operation activation signal ACTIVE. The operation of the control unit shown in FIG. 1 will now be described with reference to the flow chart of FIG. 2 with a burst length of 4.

At clock cycle #0, an active command is applied, whereby an internal operation activation designating signal ACT as a memory cell select operation commence designating signal is rendered active. In response to activation of internal operation activation signal ACT, flipflop 40d of row related control circuit 40 is set to render internal operation activation signal ACTIVE active.

At clock cycle #4, a read command is applied together with an auto precharge command (auto PC). In response to this read command, read operation designating signal R from command decoder 20 is activated, and auto precharge operation designating signal APC is also activated. In response to activation of read operation designating signal R, burst length counter 28a in read control circuit 28 is reset to its initial state to start a count operation. Also, flipflop 28b is set, and read operation activation signal READ is set to an active state of an H level. In row related control circuit 40, flipflop 40a is set in response to auto precharge operation designating signal APC of an active state, and auto precharge operation enable signal APCE is set to an active state of an H level. Readout operation activation signal READ attains an H level, and output signal R/W of OR circuit 42a attains an H level. Therefore, the output signal of one shot pulse generation circuit 42b attains an L level, and AND circuit 40b is set to a disable state. The output signal (auto precharge operation trigger signal) PC2 of AND circuit 40b attains an L level.

Data readout is effected internally in response to activation of read operation activation signal READ. At clock cycle #8, a read command is applied again. In response, read operation designating signal R is rendered active again to cause burst length counter 28a to be reset to its initial state, and output of a count up signal from burst length counter 28a is inhibited. Thus, flipflop 28b maintains a set state, and read operation activation signal READ maintains an active state of an H level.

At clock cycle #12, a write command is applied. In response to this write command, write operation designating signal W is driven to an H level of the active state. In read control circuit 28, the count operation of burst length counter 28a is completed (burst length is 4), and flipflop 28b is reset in response to a count up signal from burst length counter 28a, and read operation activation signal READ is set to an inactive state of an L level. In response to an active write designating signal W, flipflop 26b is set and write operation activation signal WRITE is set to an active state of an H level in write control circuit 26. Furthermore, burst length counter 26a is set to initiate a count operation. Since read operation activation signal READ is pulled down to an L level and write operation activation signal WRITE is set to an active state of an H level at clock cycle #12, output signal R/W of OR circuit 42a maintains an H level. As a result, the output signal of one shot pulse generation circuit 42b attains an L level, and AND circuit 40b maintains a disable state. Inactivation of internal operation activation signal ACTIVE is inhibited.

At clock cycle #16, a write command is applied again, whereby write operation designating signal W is rendered active. Internal write operation activation signal WRITE is maintained at an active state of an H level. Burst length counter 26a responds to this newly applied write command to be reset to its initial value to commence a counter operation.

At clock cycle #20, a read command is applied. During this clock cycle #20, burst length counter 26a completes its count operation to output a count up signal, and flipflop 26b is reset (burst length is 4). As a result, write operation activation signal WRITE is rendered inactive at an L level. In response to a read command, read operation designating signal R is rendered active, and read operation activation signal READ is set to an active state of an H level again.

When burst length counter 28a completes its count operation (4 clock cycles), flipflop 28b is reset in response to a count up designating signal from burst length counter 28a at clock cycle #24, whereby read operation activation signal READ is set to an inactive state of an L level. In response to inactivation of read operation activation signal READ in clock cycle #24, output signal R/W of OR circuit 42a is pulled down to an L level, and one shot pulse generator 42b generates a one shot pulse signal. In response to a pulse signal provided from one shot pulse generator 42b, AND circuit 40b is enabled. In response to auto precharge operation enable signal APCE, auto precharge operation trigger signal PC2 from AND circuit 40b is set to an active state of an H level. In response to activation of auto precharge operation trigger signal PC2, the output signal of OR circuit 40c is pulled up to an H levels and flipflop 40d is reset. Internal operation activation signal ACTIVE is set to an inactive state of an L level.

Since completion of an internal access operation is determined by internal operation completion detection circuit 42 and an auto precharge operation is inhibited during execution of an internal access operation, a precharge operation can be effected automatically at the completion of all accesses by just applying an auto precharge command together with one command as long as the intervals of the access commands of read or write are not longer than the burst length.

Figure 3:
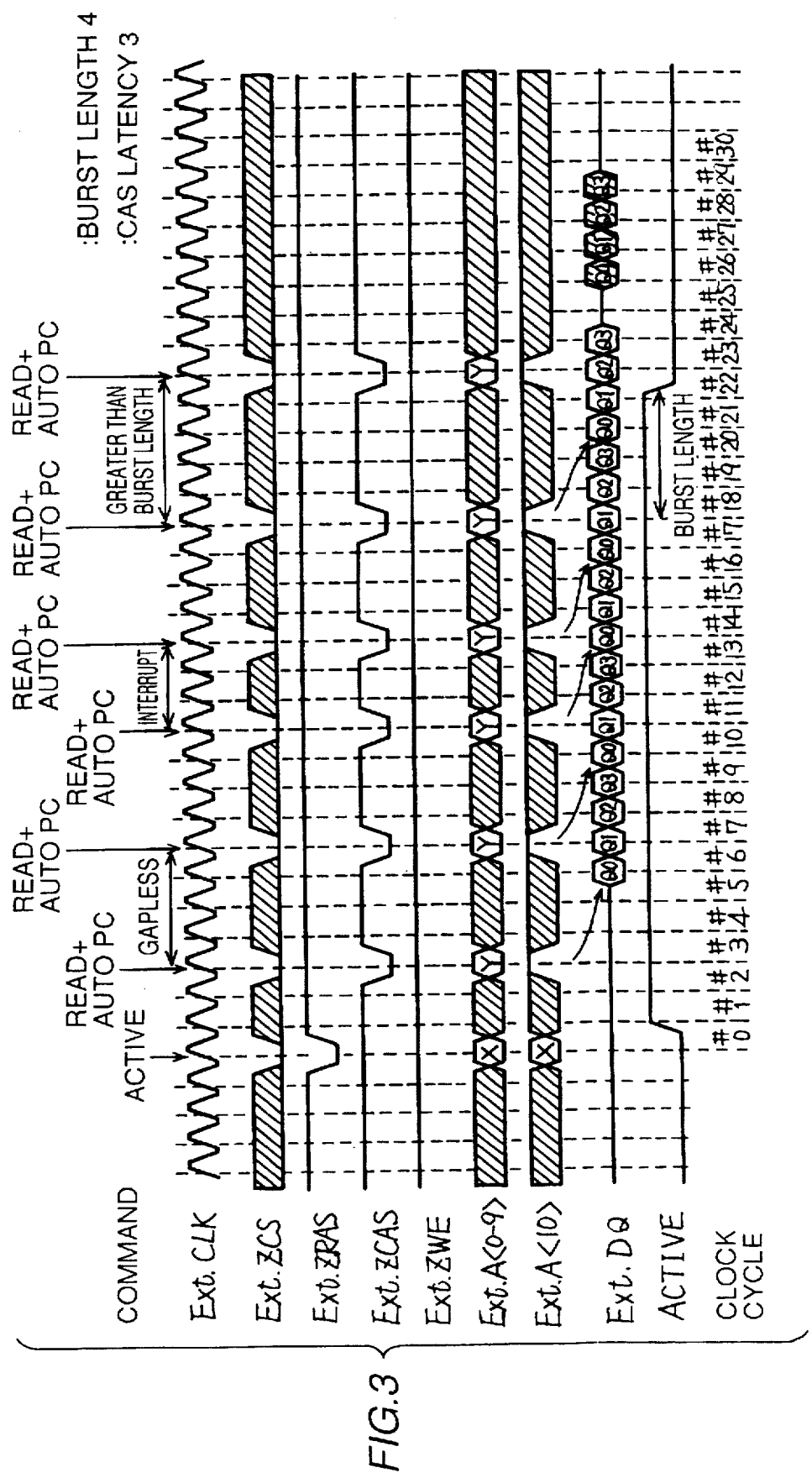
FIG. 3 is a timing chart representing an operation of data readout in the synchronous semiconductor memory device of FIG. 1.

FIG. 3 is a timing chart showing the state of external signals and internal operation activation signal ACTIVE according to the first embodiment of the present invention. FIG. 3 shows those in data read out where the burst length is 4 and the CAS latency is 3.

At clock cycle #0, an active command is applied. This active command is applied by setting external control signals ExtZCAS and ExtZRAS to an L level and external control signals ExtZCAS and ExtWE to an H level at a rise of clock signal CLK. According to this active command, external address signal bits ExtA<0-10> are entered as a row address signal X and an internal memory cell select operation is started.

At clock cycle #2, a read command and an auto precharge command are applied. In applying a read command, external control signals ExtZCS and ExtZCAS are set to an L level, and external control signals ExtZRAS and ExtWE are set to an H level. In response to this read command, external address signal bits ExtA<0-9> are entered as a column address signal Y, whereby an internal column select operation is carried out to effect a data reading operation. An auto precharge command is applied by setting external address bit signal ExtA<10> to an H level simultaneously to the read command. Since the burst length is 4 and the CAS latency is 3, the internally selected and readout memory cell data are sequentially read out as external data Q0–Q3 in synchronization with clock signal CLK from clock cycle #6.

At the elapse of 4 clock cycles from clock cycle #3 in which a read command was applied, i.e. at clock cycle #7, a read command and an auto precharge command are applied again. Internally, a burst length count operation is initiated again, and internal operation activation signal ACTIVE maintains an H level. According to the read command applied at clock cycle #7, data Q1–Q3 are sequentially read out in synchronization with clock signal CLK from clock cycle 11.

At clock cycle #14, a read command and an auto precharge command are applied. The number of clock cycles between clock cycle #14 and clock cycle #11 is 3, which is smaller than the burst length. Therefore, data Q3 that is to be read out according to the read command applied at clock cycle #11 is not read out in response to the read command applied at clock cycle #14, and four new data Q0–Q3 are read out in synchronization with clock signal CLK.

At clock cycle #18, a read command and an auto precharge command are applied again. Data Q0–Q3 are sequentially read out from clock cycle #21.

At clock cycle #23, a read command and an auto precharge command are applied. The number of clock cycles between clock cycles #23 and #18 is 5, which is greater than the burst length. Therefore, a precharge operation is carried out according to the auto precharge command applied at clock cycle #18, and internal operation activation signal ACTIVE is set to an inactive state at clock cycle #22 at an elapse of the burst length from clock cycle #18. Therefore, data is not read out for the read command applied at clock cycle #23 (indicated by inclined lines in FIG. 8).

By applying a read command in intervals of burst lengthes (gapless), data can be read out continuously. Furthermore, by providing a read command at an interval shorter than the burst length, data can be read out according to a new read command (interrupt) instead of the data by the previous read command. Therefore, data can be read out continuously by providing a read command at intervals not longer than the burst length. Here, the required data can be read out properly even when an auto precharge command is provided with the read command. Therefore, external address signal bit ExtA<10> can be held at an H level in the application of all read commands to alleviate the load of control for applying an auto precharge command of the external control device.

Figure 4:
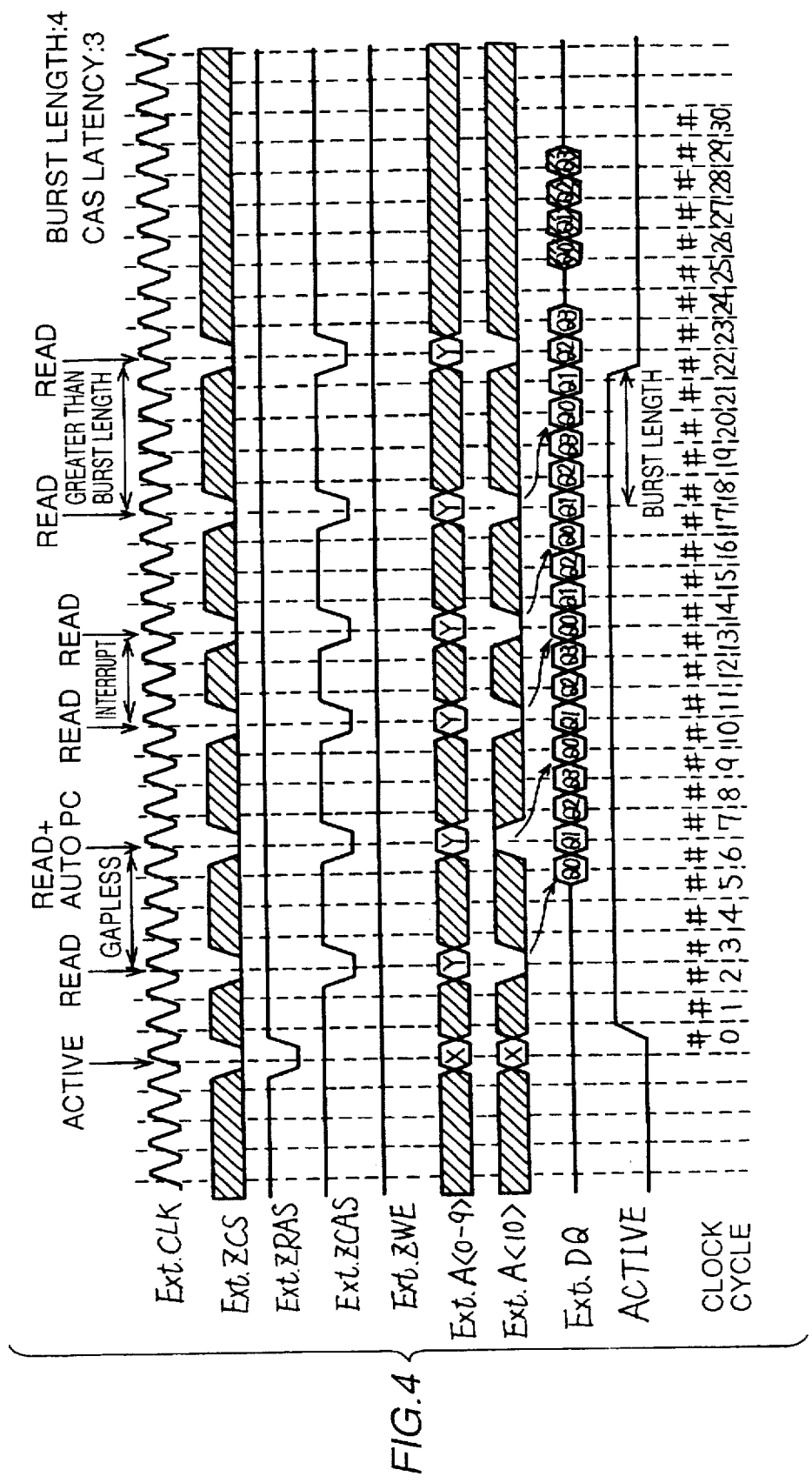
FIGS. 4–7 are timing charts each representing an operation of the synchronous semiconductor memory device of FIG. 1.

FIG. 4 shows another sequence of external control signals according to the first embodiment of the present invention. Referring to FIG. 4, an active command is applied at clock cycle #0, and a read command is applied at clock cycle #3. According to this read command, data Q0–Q3 is sequentially read out in synchronization with clock signal CLK from clock cycle #6 at an elapse of the CAS latency. At clock cycle #7, a read command is applied together with an auto precharge command (auto PC). According to this read command, four new data Q0–Q3 are sequentially read out in synchronization with clock signal CLK from clock cycle #10. A read command is applied at the following respective clock cycles of #11, #14 and #18. At the application of each of these read commands, address signal bit Ext<10> is set to an L level, and an auto precharge command is not applied. Data is sequentially read out according to these read commands.

An access command is not applied during four clock cycles equal to the burst length after a read command is applied at clock cycle #18. Therefore, an auto precharge operation is carried out internally according to the auto precharge command applied at clock cycle #7. Internal operation activation signal ACTIVE is set to an inactive state at clock cycle #22. Therefore, even if a read command is applied at clock cycle #23, the data read out by this read command is not the proper data.

By applying an auto precharge command together with an arbitrary read command in a page mode operation in which a read command is applied at an interval shorter than the burst length since an application of an active command, a precharge operation can be effected internally at the completion of a page mode operation accurately. In this case, only an auto precharge command is to be applied together with an arbitrary (during a page mode operation period) read command in a page mode operation. It is not necessary to identify the last command of the page operation. Therefore, the load of the external control device is alleviated.

Figure 5:
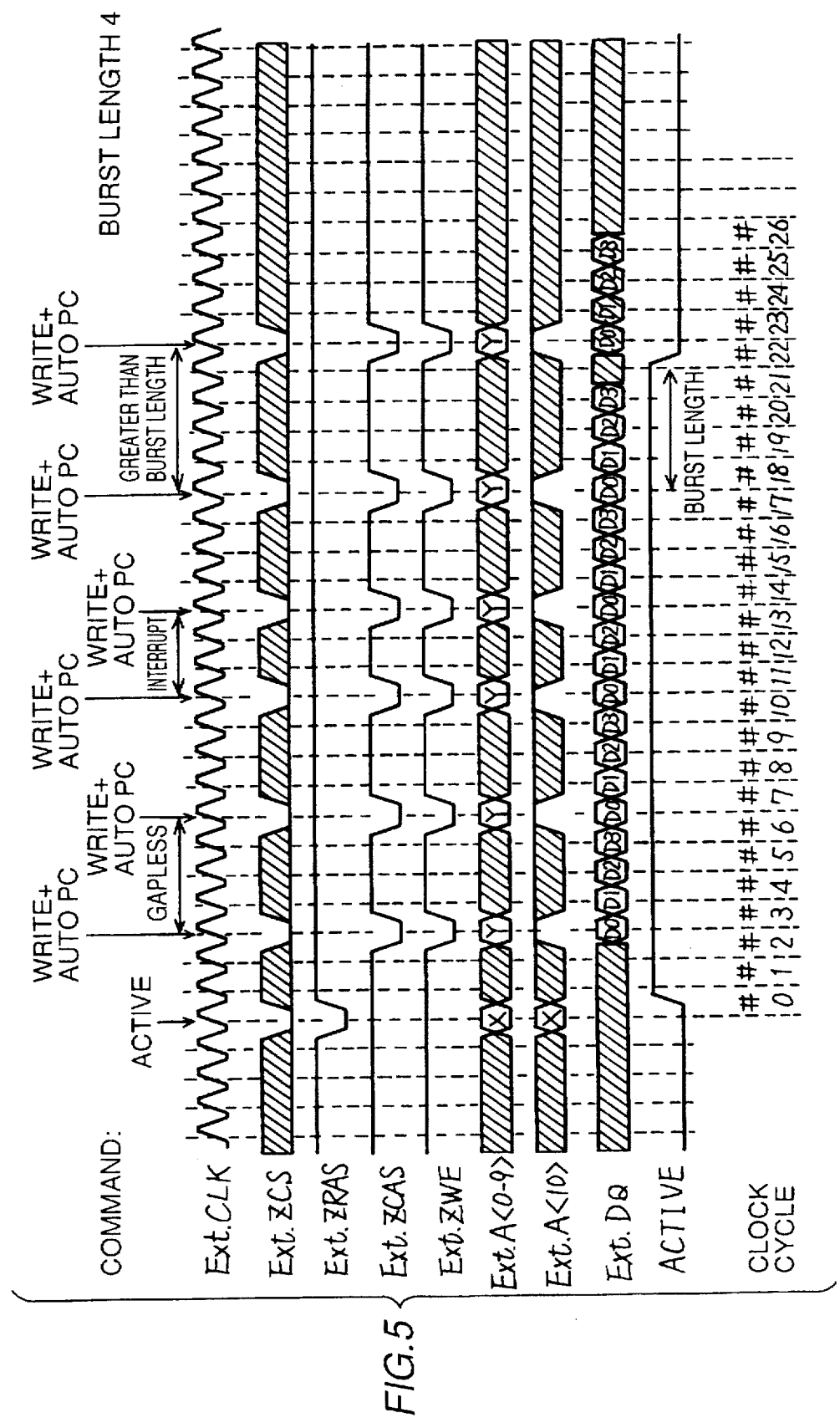

Referring to FIG. 5 a timing chart showing the states of external signals in a data writing operation, an active command is applied at clock cycle #0. Then at clock cycle #3, a write command is applied together with an auto precharge command (auto PC). A write command is applied by setting external control signals ExtZCS, ExtZWE, and ExtCAS to an L level, and external control signal ExtZRAS to an H level. Similar to data readout, an auto precharge command is applied by setting external address signal bit ExtA<10> to an H level in data writing, either. Data D0–D3 is sequentially written from clock cycle #3 according to this write command (an internal write operation is executed with a delay of 1 clock cycle; refer to write operation activation signal WRITE).

At clock cycle #7 which is at an elapse of four clock cycles equivalent to the burst length, a write command and an auto precharge command are applied again. As a result, the next write data D0–D3 are sequentially written continuously from clock cycle #7. At clock cycle #11, a write command is applied together with an auto precharge command to effect data writing. Prior to an elapse of clock cycles equal to the burst length, a write command and an auto precharge command are applied again at clock cycle #14. Data D0–D3 are sequentially written according to the new write command instead of write data D3 by the previous write command of clock cycle #11.

At clock cycle #18, a write command and an auto precharge command are applied again to effect data writing. Even if the burst length period elapses since the application of write command at clock cycle #18, the precharge operation trigger signal is rendered active, and internal operation activation signal ACTIVE is rendered inactive according to an auto precharge command already applied (an auto precharge command applied in any clock cycle) since a next write command is not applied. Even if a new write command and an auto precharge command are applied at the next clock cycle #23 under this state, the synchronous semiconductor memory device already attains a precharge state, and data writing to a memory cell is not carried out. Therefore, the data applied during clock cycles #23–26 are invalid data.

In the data writing mode, data writing can be effected in a page mode operation by applying a write command at an interval shorter than the burst length. In this case, a precharge operation is internally effected automatically after writing of required data is completed properly even when the auto precharge command is applied with all write commands.

In a data writing operation, address signal bit ExtA<10> specifying an auto precharge command can be fixed to an H level simultaneously to a write command to facilitate control of the auto precharge command.

Figure 6:
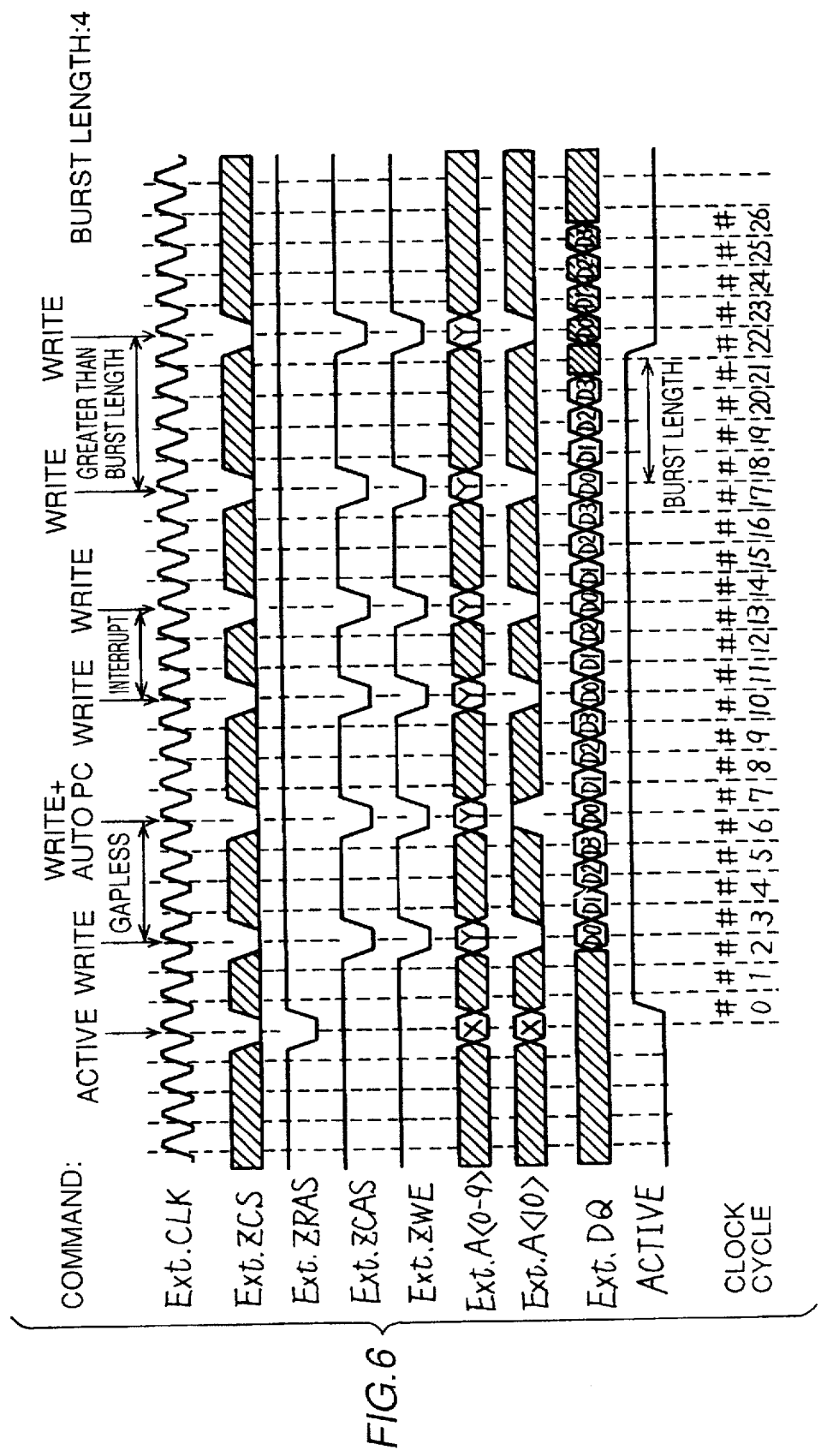

Referring to the timing chart of FIG. 6 showing another sequence of external control signals in writing data according to the first embodiment of the present invention, an active command is applied at clock cycle #1.

At clock cycle #3, a write command is applied to effect data writing. At an elapse of the burst length of clock cycle #7, a write command and an auto precharge command are applied to effect data writing again. Similar to the previous FIG. 5, write commands are applied at each of clock cycles #11, #14 and #18. An auto precharge command is not applied at the application of these write commands.

When a write command is applied at clock cycle #18 and the burst length (four clock cycles) elapses, a precharge operation is effected according to the auto precharge command applied at the previous clock cycle #7 since the next write command is not yet applied and internal operation activation signal ACTIVE is set to an inactive state of an L level. Therefore, a write command applied at clock cycle #23 will be invalid, and the writing operation of data D0–D3 applied at clock cycles #23–#26 will not be carried out.

As shown in FIG. 6, data writing can be carried out in a page mode operation by applying a write command at an interval not greater than the burst length after an active command is applied. In this page mode operation, precharge can be carried out after completion of writing of all the required data by just applying an auto precharge command simultaneously to an arbitrary write command. It is therefore not necessary to identify the last write command in a page mode operation. Thus, control of an auto precharge command is facilitated.

Figure 7:
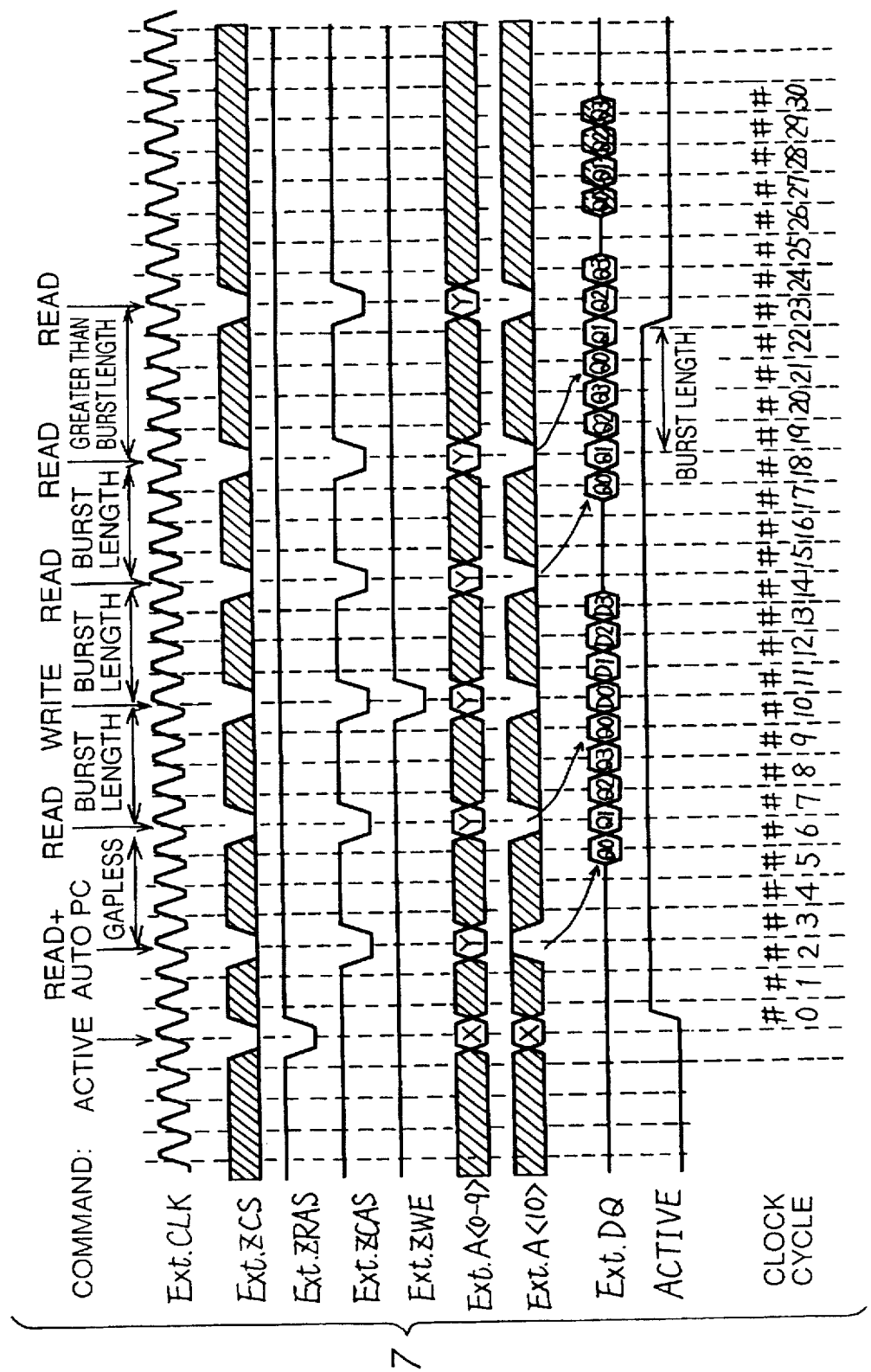

Referring to the timing chart of FIG. 7 showing a states of external signals and internal operation activation signal in the case where both data writing and reading are carried out, an active command is applied at clock cycle #0 to set internal operation activation signal ACTIVE to an active state.

At clock cycle #3, a read command and an auto precharge command are applied. In response to this read command, data Q0–Q3 are sequentially read out from clock cycle #6 at an elapse of the CAS latency. At an elapse of the burst length in clock cycle #7, a read command is applied to cause new data Q0 to be read out at clock cycle #10. When a write command is applied at clock cycle #11, external write data D0–D3 are sequentially written. Data read out is not carried out in clock cycle #11. In such a case, a mask signal is rendered active to inhibit output of the readout data (mask signal not shown) in order to prevent collision of writing data and reading out data. At clock cycle #15 corresponding to the elapse of the number of clock cycles of the burst length from clock cycle #11, a read command is applied again, and data Q0–Q3 are sequentially read out in synchronization with clock signal CLK from clock cycle #18.

At clock cycle #19 corresponding to an elapse of the burst length from clock cycle #15, a read command is applied again, and data Q0–Q3 are read out from clock cycle #22. Since an access command is not applied during the period from clock cycle #19 to clock cycle #23 corresponding to the elapse of the burst length, a precharge operation is triggered according to an auto precharge command applied at the previous clock cycle #3, whereby internal operation activation signal ACTIVE is set to an active state, and the memory cell array is set to a de-selected state. Since the internal of the synchronous semiconductor device attains a precharge state of an inactive state, a read command applied at clock cycle #24 will not effect data read out corresponding to this read command.

In applying a read command or a write command at an interval not greater than the burst length where data writing and data reading are carried in a mixed manner, the synchronous semiconductor memory device can be set to an internal precharge state automatically after completion of access of the required data by applying an auto precharge command together with an arbitrary access command.

In the operation sequence shown in FIG. 7, external address signal bit ExtA<10> can be fixed to an H level and an auto precharge command can be applied constantly in applying a read command or a write command.

Figures 8A, 8B:
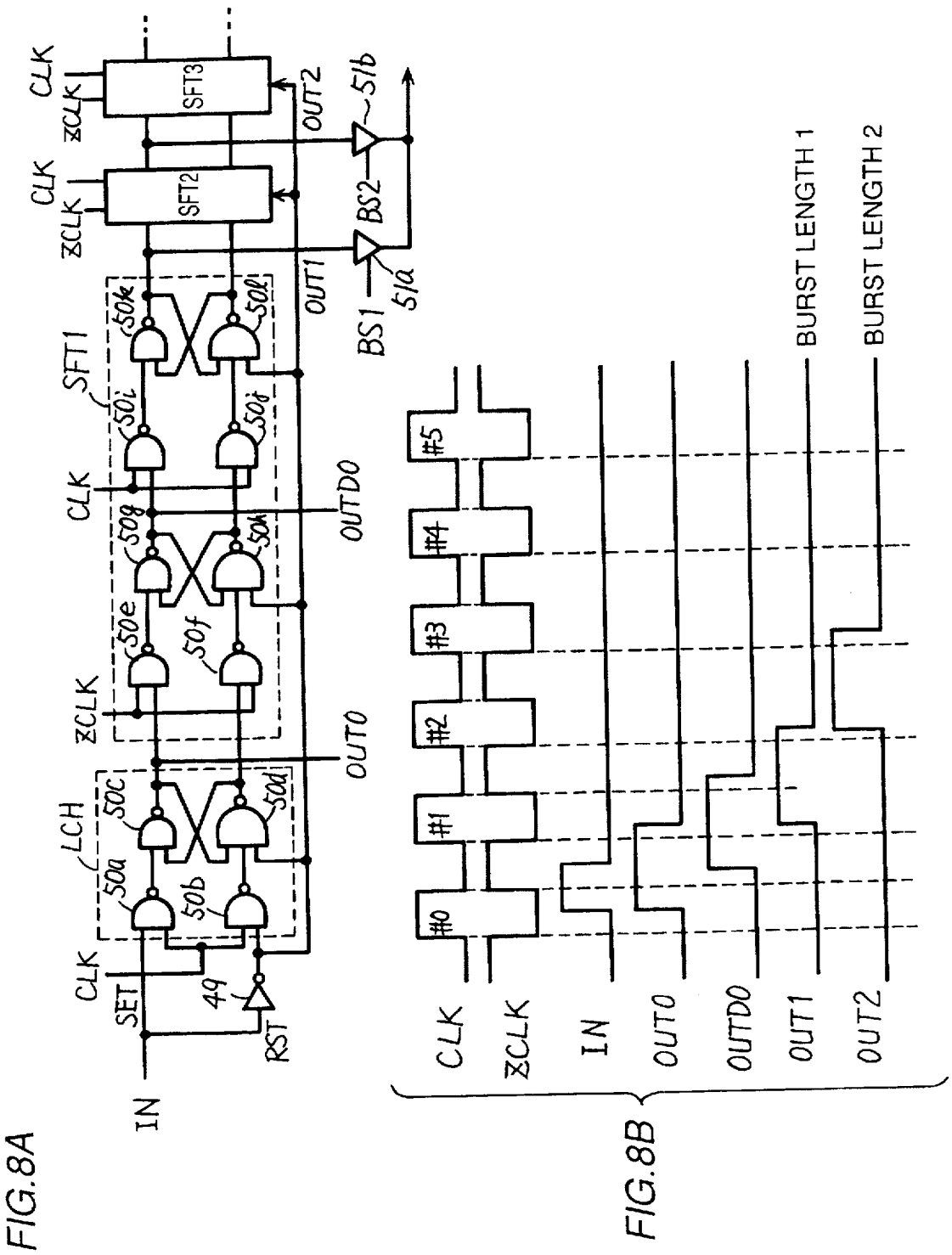
FIG. 8A shows a structure of a burst length counter of FIG. 1.
FIG. 8B is a waveform diagram representing the operation of the counter of FIG. 8A.

Referring to FIG. 8A showing a structure of burst length counters 28a and 26a of FIG. 1, the burst length counter includes a latch stage LCH for entering and latching an input signal IN (designating signal R or W) in synchronization with clock signal CLK, and cascade-connected shift stages SFT1, SFT2, SFT3, . . . for sequentially transferring an output signal OUT0 of latch stage LCH in synchronization with clock signals CLK and ZCLK. Each of shift stages SFT1–SFT3 has the same structure. Only the structure of one shift stage SFT1 is shown in FIG. 8A.

Latch stage LCH includes an NAND circuit 50a receiving an input signal IN and clock signal CLK, an NAND circuit 50b receiving an input signal applied via an inverter 49 and clock signal CLK, an NAND circuit 50c receiving the output signal of NAND circuit 50a at one input, and an NAND circuit 50d for receiving output signals of NAND circuit 50b, inverter 49, and NAND circuit 50c. The output signal of NAND circuit 50d is applied to the other input of NAND circuit 50c.

Shift stage SFT1 includes an NAND circuit 50e receiving clock signal ZCLK complementary to clock signal CLK and an output signal of NAND circuit 50c, an NAND circuit 50f receiving clock signal ZCLK and an output signal of NAND circuit 50d, an NAND circuit 50g receiving an output signal of NAND circuit 50e at one input, and an NAND circuit 50h receiving output signals of NAND circuit 50f, NAND circuit 50g, and inverter 49. The output signal of NAND circuit 50h is applied to the other input of NAND circuit 50g.

Shift stage SFT1 further includes an NAND circuit 50i receiving clock signal CLK and an output signal of NAND circuit 50g, an NAND circuit 50j receiving clock signal CLK and an output signal of NAND circuit 50h, an NAND circuit 50k receiving the output signal of NAND circuit 50i at one input, and an NAND circuit 50l receiving output signals of NAND circuit 50j, NAND circuit 50k and inverter 49. The output signal of NAND circuit 50l is applied to the other input of NAND circuit 50k.

Output signals OUT1, OUT2 . . . of shift stages SFT1, SFT2, . . . are applied to 3-state buffers 51a, 51b, . . . enabled in response to burst length select signals BS1, BS2, . . . One of burst length select signals BSr, BS2, . . . is rendered active in response to a signal from a burst length set circuit not shown, whereby a corresponding 3-state buffer is enabled (operable state). The output signal of the activated 3-state buffer is applied to a reset input RST of flipflop 26b or 28b as a count up signal. The operation of the circuit of FIG. 8A will be now described with reference to FIG. 8B.

At clock cycle #0, input signal IN is set to an active state of an H level. Clock signal CLK attains an H level, and latch stage LCH enters and passes this input signal IN, which is latched by NAND circuits 50c and 50d. As a result, output signal OUT0 of latch stage LCH is pulled up to an H level. When clock signal CLK is pulled down to an L level and clock signal ZCLK is pulled up to an H level, latch stage LCH is set to a latch state with the output signals of NAND circuits 50a and 50b fixed to an H level. In shift stage SFT1, NAND circuits 50e and 50f receive the signals applied from latch stage LCH, whereby NAND circuits 50g and 50h latch the applied signals. As a result, internal output signal OUTD0 is pulled up to an H level. In this state, output signals of NAND circuits 50i and 50j are fixed to an H level (clock signal CLK is at an L level).

When clock signal CLK is pulled up to an H level at clock cycle #1, clock signal ZCLK is pulled down to an L level, and the output signals of NAND circuits 50e and 50f are fixed to an H level, whereby shift stage SFT1 is set to a latch state. NAND circuits 50i and 50j are enabled to receive, latch, and provide output signal OUTD0. As a result, output signal OUT1 of shift stage SFT1 is set to an H level.

When clock signal CLK is pulled up to an H level again at clock cycle #2, output signal OUT2 from shift stage SFT2 is driven to an H level. Output signal OUT1 corresponds to a burst length 1, and output signal OUT2 corresponds to a burst length 2.

In applying input signal IN, the output signal of inverter 49 is pulled down to an L level from an H level. In shift stages SFT1, SFT2, SFT3, . . . , the input stages formed of NAND circuits 50e and 50f provide signals of an H level in response to clock signal ZCLK at L level. When the output signal of inverter 49 is pulled down to an L level, the output signal of NAND circuit 50h is driven to an H level, and output signal OUTD0 is reset to an L level (output signal of NAND circuit 50e is at an H level). When the output signal of inverter 49 is driven to an L level during an H level duration of output signal OUT1 in NAND circuit 50k, the output signal of NAND circuit 50l is set to an H level, whereby the output signal of NAND circuit 50k is reset to an L level (the output signal of NAND circuit 50i attains an H level since the output signal of NAND circuit 50g attains an L level). Thus, all shift stages SFT1, . . . can be reset when input signal IN attains an active state of an H level.

When an access command is newly applied in a burst length count operation, the count operation can be commenced from the initial value again.

Figure 9A:
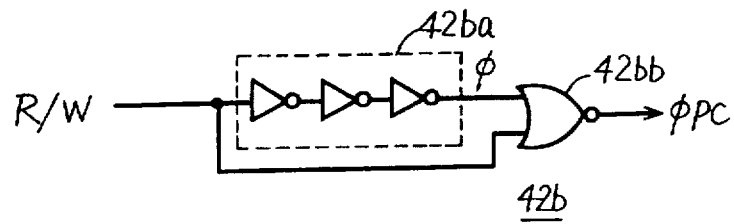
FIG. 9A shows an example of a structure of a one shot pulse generation circuit of FIG. 1.
Figure 9B:
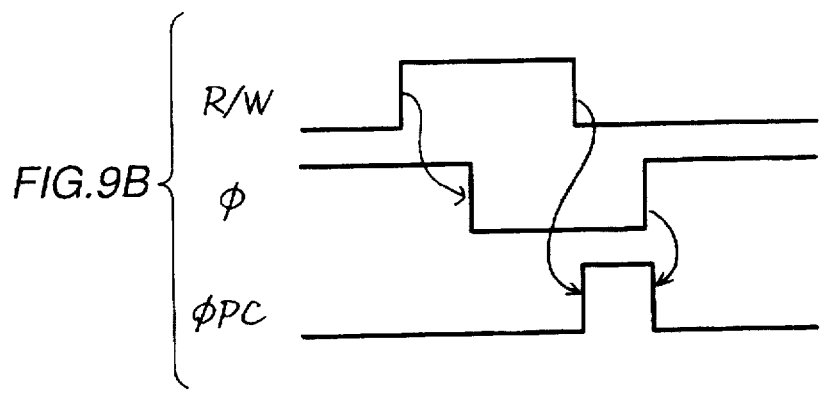
FIG. 9B is a waveform diagram of an operation thereof.

FIG. 9A exemplifies a structure of one shot pulse generator 42b of FIG. 1. Referring to FIG. 9A, one shot pulse generator 42b includes an invert delay circuit 42ba for inverting and delaying for a predetermined time period signal R/W provided from OR circuit 42a, and an NOR circuit 42bb receiving signal R/W and output signal φ from invert delay circuit 42ba. Output signal φPC from NOR circuit 42bb is applied to AND circuit 40b shown in FIG. 1. The operation of one shot pulse generator 42b will be now described with reference to the operation waveform diagram of FIG. 9B.

When signal R/W attains an L level, output signal φ of invert delay circuit 42ba attains an H level and output signal φPC of NOR circuit 42bb attains an L level. When signal R/W is driven to an H level from an L level, output signal φPC of NOR circuit 42bb is fixed to an L level irrespective of the level of the output signal of invert delay circuit 42ba. When signal R/W is pulled down to an L level from an H level, output signal φ of invert delay circuit 42b still attains an L level, whereby output signal φPC of NOR circuit 42bb is driven to an H level. At an elapse of the delay time of invert delay circuit 42ba, output signal φ of invert delay circuit 42ba is driven to an H level, and output signal φPC from NOR circuit 42bb is pulled down to an L level. Thus, a one shot pulse signal having a pulse width corresponding to the delay time of invert delay circuit 42ba can be generated at the completion of an internal write/read (access) operation.

The first embodiment of the present invention provides a structure in which an auto precharge command is made valid when an internal access operation is completed to initiate an internal precharge operation when an auto precharge command is applied. It is therefore not necessary to identify the final command of the page mode in a page operation mode. Thus, control of an auto precharge command is facilitated.

Second Embodiment

Figure 10:
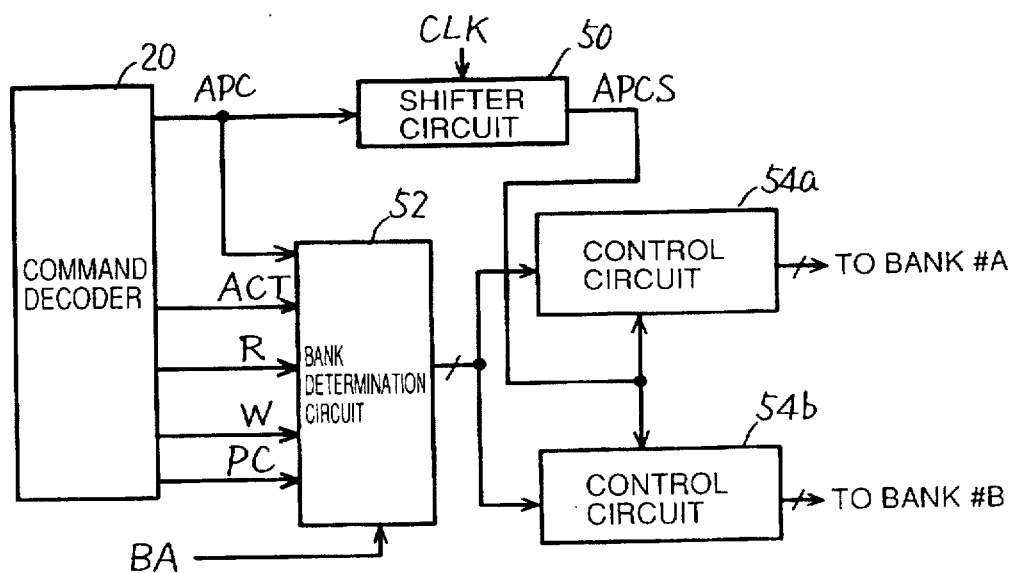
FIG. 10 schematically shows a structure of the control portion of a synchronous semiconductor memory device according to a second embodiment of the present invention.

FIG. 10 shows the main part of a synchronous semiconductor memory device according to a second embodiment of the present invention. The synchronous semiconductor memory device according to the structure of FIG. 10 includes two banks #A and #B. The synchronous semiconductor memory device includes a command decoder 20 having a structure similar to that of the first embodiment, a shifter circuit 50 for shifting auto precharge operation designating signal APC from command decoder 20 for a predetermined time period in synchronization with clock signal CLK, a bank determination circuit 52 receiving internal operation designating signals APC, ACT, R, W and PC from command decoder 20 for transferring an internal operation designating signal for either bank #A or #B according to bank address signal BA, a control circuit 54a responsive to an internal control operation designating signal from bank determination circuit 52 for carrying out control with respect to bank #A, and a control circuit 54b for carrying a control operation with respect to bank #B according to an internal operation designating signal from bank determination circuit 52.

Control circuits 54a and 54b are supplied with a shift signal APCS from shifter circuit 50. Shifter circuit 50 shifts auto precharge operation designating signal APC for a time period corresponding to the number of clock cycles defined by the burst length for example.

Therefore, shift signal APCS from shifter circuit 50 is a delayed version of auto precharge operation designating signal APC by a clock cycle period corresponding to the burst length. By applying shift signal APCS from shifter circuit 50 to control circuits 54a and 54b, shifter circuit 50 carrying out an auto precharge operation is commonly shared by banks #A and #B. Therefore, the occupying area of the control portion can be reduced. The number of shift clocks of shifter circuit 50 does not have to be equal to the burst length.

Figure 11:
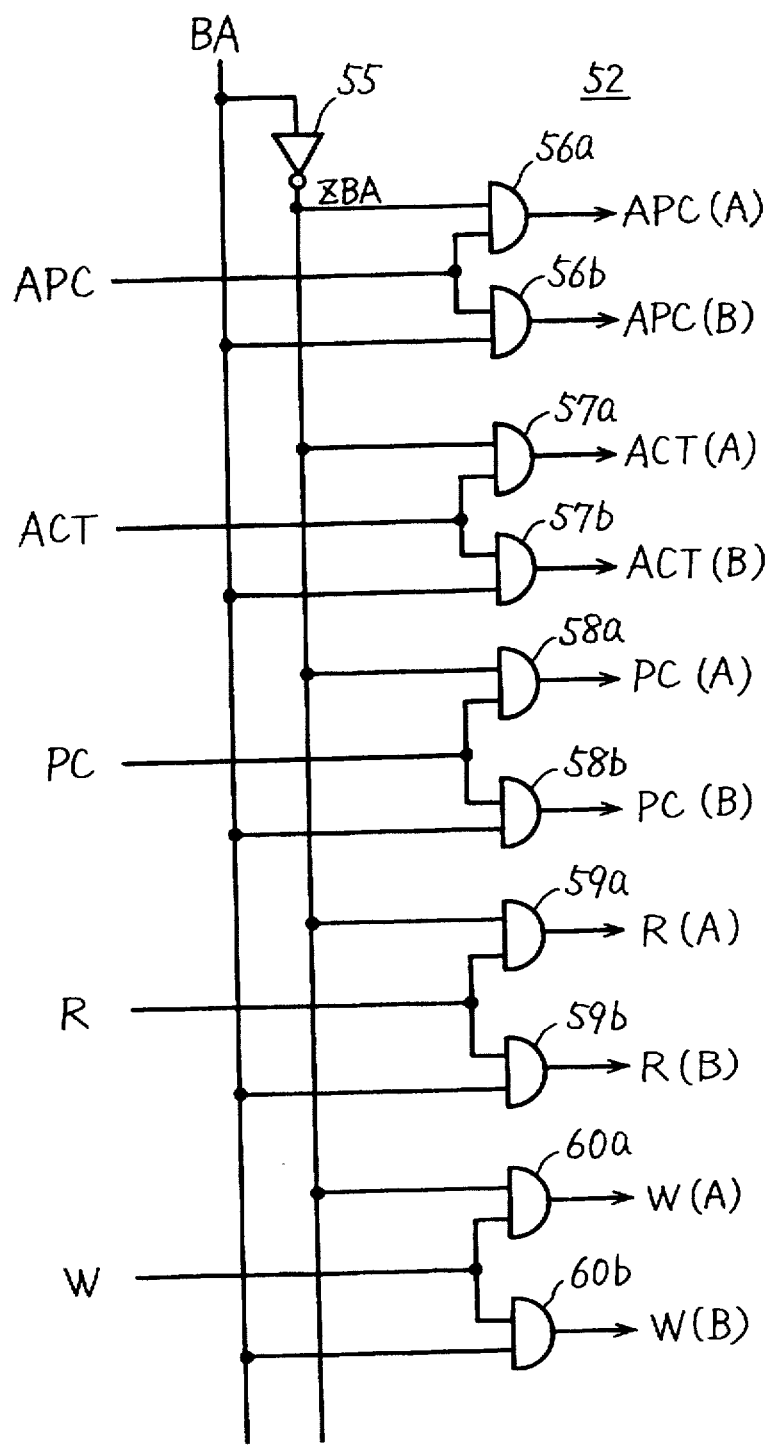
FIG. 11 schematically shows a structure of a bank determination circuit of FIG. 10.

Referring to FIG. 11, a bank determination circuit 52 includes an inverter 55 for inverting bank address signal BA. Bank #A is designated when bank address signal BA attains an L level. Bank #B is designated when bank address signal BA attains an H level.

A gate is provided for each of the internal operation designating signals provided from the command decoder (refer to FIG. 10) for transmitting an internal operation designating signal to either bank #A or #B according to the logic value of bank address signal BA. An AND circuit 56a for receiving the output signal of inverter 55 and auto precharge operation designating signal APC, and an AND circuit 56b for receiving auto precharge operation designating signal APC and bank address signal BA are provided for auto precharge operation designating signal APC. An auto precharge operation designating signal APC(A) for bank #A is provided from AND circuit 56a. An auto precharge operation designating signal APC(B) for bank #B is provided from AND circuit 56b.

An AND circuit 57a receiving internal operation activation designating signal ACT and output signal ZBA of inverter 55, and an AND circuit 57b receiving internal operation activation designating signal ACT and bank address signal BA are provided for internal operation activation designating signal ACT. An internal operation activation designating signal ACT(A) designating commence of a memory cell select operation for bank #A is provided from AND circuit 57a. An internal operation activation designating signal ACT(B) for bank B is provided from AND circuit 57b.

An AND circuit 58a receiving precharge operation designating signal PC and bank address signal ZBA, and an AND circuit 58b receiving precharge operation designating signal PC and bank address signal BA are provided for precharge operation designating signal PC. A precharge operation designating signal PC(A) for bank #A is provided from AND circuit 58a. A precharge operation designating signal PC(B) for bank #B is provided from AND circuit 58b. A precharge command activating this precharge operation designating signal PC is specified by setting external control signals to predetermined states at a rise of clock signal CLK. The precharge command differs from the auto precharge command.

An AND circuit 59a receiving bank address signal ZBA and read operation designating signal R, and an AND circuit 59b receiving read operation designating signal R and bank address signal BA are provided for read operation designating signal R. A read operation designating signal R(A) for bank #A is provided from AND circuit 59a. A read operation designating signal R(B) for bank #B is provided from AND circuit 59b.

An AND circuit 60a receiving bank address signal ZBA and write operation designating signal R, and an AND circuit 60b receiving write operation designating signal W and bank address signal BA are provided for write operation designating signal W. A write operation designating signal W(A) for bank #A is provided from AND circuit 60a. A write operation designating signal W(B) for bank #B is provided from AND circuit 60b.

Each of AND circuits 56a–60a and 56b–60b are enabled when a corresponding bank address signal is driven to an H level, to transfer an internal operation designating signal to a corresponding bank. Therefore, only the bank specified by the bank address signal executes the specified internal operation. According to the structure of bank determination circuit 52, one bank can be driven to an active state or a precharge state when the other bank is in an active state.

Figure 12:
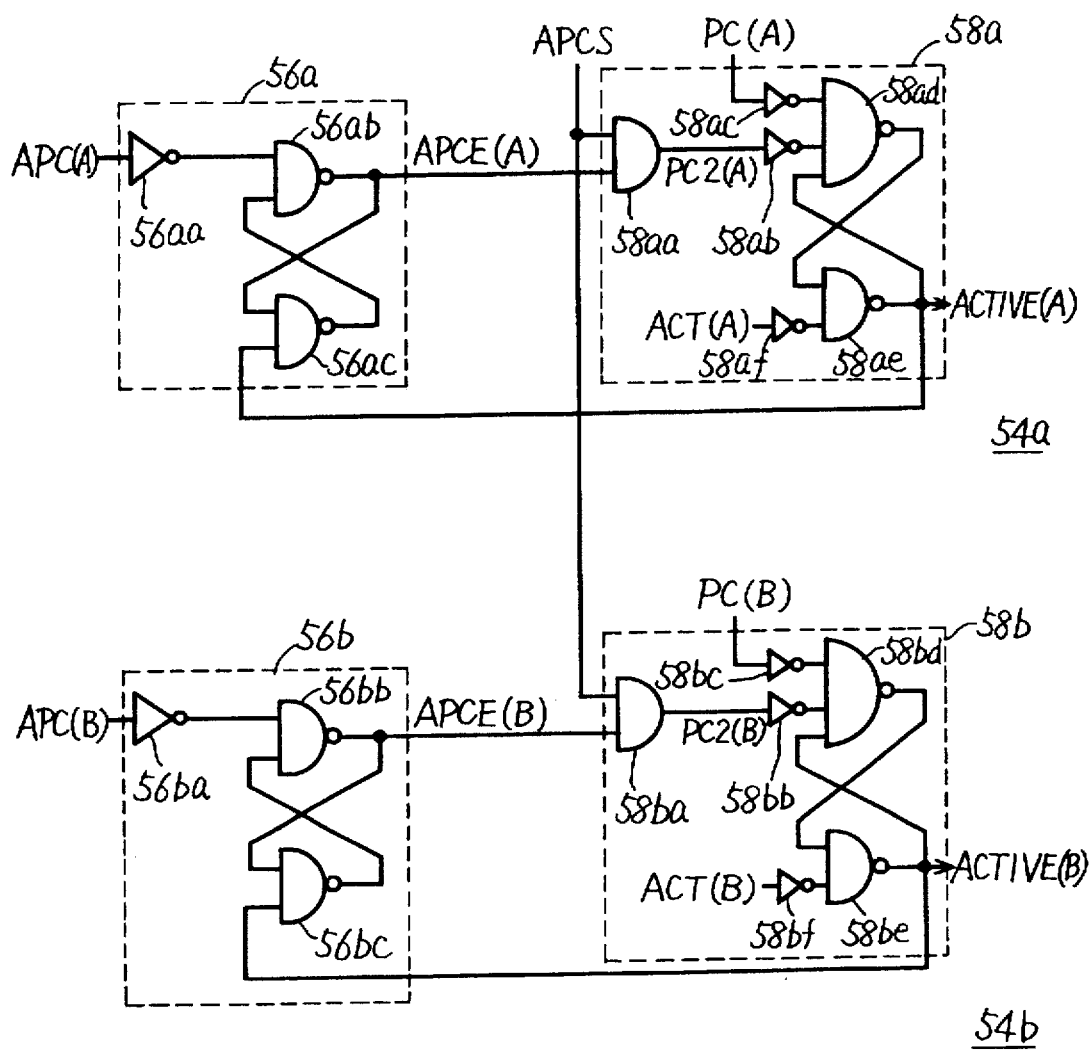
FIG. 12 shows a structure of an internal operation activation signal generation unit in the control circuit of FIG. 10.

FIG. 12 shows the structure of the portion of control circuits 54a and 54b of FIG. 10 for generating internal operation activation signals ACTIVE(A) and ACTIVE(B).

Referring to FIG. 12, control circuit 54a for bank #A includes a flipflop 56a set when auto precharge operation designating signal APC(A) is active to render auto precharge enable signal APCE(A) active, and reset when internal operation activation signal ACTIVE(A) is inactive, and a flipflop 58a set when internal operation activation designating signal ACT(A) is active to render internal operation activation signal ACTIVE(A) active. Flipflop 58a is reset when auto precharge shift signal APCS shown in FIG. 10 and auto precharge enable signal APCE(A) are both active or when precharge operation activation signal PC(A) is active.

Flipflop 56a includes an inverter 56aa for receiving auto precharge operation designating signal APC(A), an NAND circuit 56ab for receiving an output signal of inverter 56aa at one input and providing auto precharge enable signal APCE(A), and an NAND circuit 56ac for receiving an auto precharge enable signal APCE(A) provided from NAND circuit 56ab and internal operation activation signal ACTIVE(A). The output signal of NAND circuit 56ac is applied to the other input of NAND circuit 56ab.

Flipflop 58a includes an AND circuit 58aa receiving auto precharge command shift signal APCS and auto precharge enable signal APCE(A), an inverter 58ab for receiving auto precharge operation trigger signal PC2(A) from AND circuit 58aa, an inverter 58ac for receiving precharge operation designating signal PC(A), an NAND circuit 58ad for receiving output signals of inverters 58ab and 58ac, an inverter 58af for receiving internal operation activation designating signal ACT(A), and an NAND circuit 58ae for receiving output signals of inverter 58af and NAND circuit 58ab for providing an internal operation activation signal ACTIVE (A). The output signal of NAND circuit 58ae is applied to the remaining input of NAND circuit 58ad.

Control circuit 54b for bank #B includes a flipflop 56b set, when auto precharge operation designating signal APC(B) is active, to render auto precharge enable signal APCE(B) active, and reset when internal operation activation signal ACTIVE(B) is inactive, and a flipflop 58b set, when internal operation activation designating signal ACT(B) is activate, to render internal operation activation signal ACTIVE(B) active. Flipflop 58b is reset when shift signal APCS and auto precharge enable signal APCE(B) are both active or when precharge operation designating signal PC(B) is active to render internal operation activation signal ACTIVE(B) inactive.

Flipflop 56b includes an inverter 56ba for receiving auto precharge operation designating signal APC(B), an NAND circuit 56bb for receiving an output signal of inverter 56ba at one input and providing auto precharge enable signal APCE(B), and a n NAND circuit 56bc for receiving an output signal of NAND circuit 56bb and internal operation activation signal ACTIVE(B). The output signal of NAND circuit 56bc is applied to the other input of NAND circuit 56bb.

Figure 13:
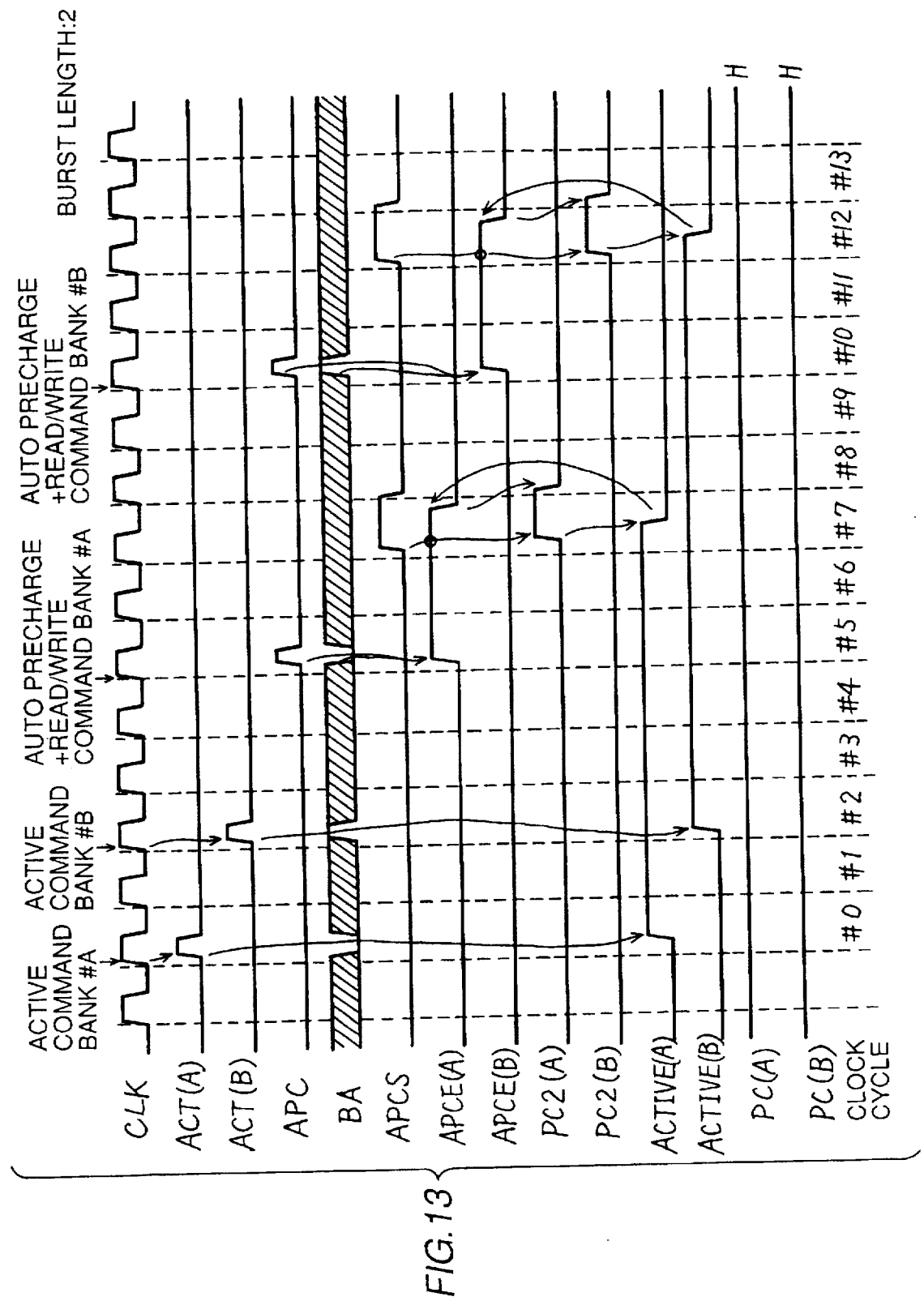
FIG. 13 is a timing chart representing an operation of the internal operation activation signal generation unit shown in FIG. 12.

Flipflop 58b includes an AND circuit 58ba for receiving auto precharge shift signal APCS and auto precharge enable signal APCE(B), an inverter 58bb for receiving an output signal of AND circuit 58ba, an inverter 58bc for receiving precharge operation designating signal PC(B), an NAND circuit 58bd for receiving output signals of inverters 58bb and 58bc, an inverter 58bf for receiving internal operation activation designating signal ACT(B), and an NAND circuit 58be for receiving output signals of NAND circuit 58bd and inverter 58bf for providing internal operation activation signal ACTIVE(B). The output signal of NAND circuit 58be is applied to the remaining input of NAND circuit 58bd. The operation of the control circuit shown in FIG. 12 will be now described with reference to the timing chart of FIG. 13. FIG. 13 shows the case where the burst length and the number of shift clocks of shifter circuit 50 are both 2.

At clock cycle #0, an active command for bank #A is applied. In response to this active command and bank address signal BA (L level), internal operation activation designating signal ACT(A) for bank #A is rendered active for a predetermined time period. Flipflop 58a is set, and internal operation activation signal ACTIVE(A) is set to an active state of an H level. As a result, a memory cell select operation is initiated at bank #A.

At clock cycle #2, an active command for bank #B is applied (bank address signal BA attains an H level). In response, internal operation commence designating signal ACT(B) for bank #B is rendered active. Flipflop 58b is set, and internal operation activation signal ACTIVE(B) for bank #B is set to an active state.

At clock cycle #5, a read command or a write command (read/write command) and an auto precharge command are applied to bank #A. In response to this auto precharge command, auto precharge operation designating signal APC (A) for #A is set to an active state. Flipflop 56a is set, and auto precharge enable signal APCE(A) is set to an active state of an H level. Auto precharge operation designating signal APC is also applied to shifter circuit 50 shown in FIG. 10. Shifter circuit 50 shifts the applied auto precharge designating signal APC for a predetermined number of clock cycles (the burst length of 2 in the present embodiment). According to an access command of a read command or a write command applied at clock cycle #5, access for bank #A is effected to carry out data reading or writing. At clock cycle #7 corresponding to the burst length of 2, shift signal APCS from shifter circuit 50 shown in FIG. 10 is set to an active state of an H level, auto precharge enable signal PC2(A) from AND circuit 58aa is set to an active state of an H level, and the output signal of NAND circuit 58ad is set to an H level, whereby internal operation activation signal ACTIVE(A) from NAND circuit 58ae is set to an inactive state of an L level. In response to inactivation of internal operation activation signal ACTIVE(A) for bank #A, flipflop 56a is reset, and auto precharge operation enable signal APCE(A) is set to an inactive state of an L level. In response, auto precharge operation enable signal PC2(A) is set to an inactive state of an L level.

As a result, the memory cell array in bank #A is set to a precharge state of an inactive state.

At clock cycle #10, an access command (read/write command) for bank #B and an auto precharge command are applied. According to auto precharge operation designating signal APC and bank address signal BA of an H level, auto precharge operation designating signal APC(B) for bank #B is set to an active state of an H level, whereby flipflop 56b is set to pull up auto precharge enable signal APCE(B) to an H level. Auto precharge operation designating signal APC is applied to shifter circuit 50 of FIG. 10. According to the access command applied at clock cycle #10, an access operation for bank #B is effected to write or read data.

When the shift operation by shifter circuit 50 of FIG. 10 is completed, shift signal APCS is set to an active state of an H level. In response, auto precharge enable signal PC2(B) provided from AND circuit 58ba is set to an active state of an H level. Flipflop 58b is reset, and internal operation activation signal ACTIVE(B) is set to an inactive state of an L level. In response to an inactivation of internal operation activation signal ACTIVE(B) for bank #B, flipflop 50b is reset, and auto precharge enable signal APCE(B) is set to inactive state of an L level. In response, precharge operation enable signal PC2(B) is set to an inactive state of an L level. As a result, the memory cell array in bank #B is set to a precharge state.

By providing a shifter circuit for carrying out an auto precharge operation in common with banks #A and #B, and by providing a portion for generating a signal for activating this auto precharge operation in response to an auto precharge command individually for the respective banks, an auto precharge operation can be executed with respect to a specified band according to an output of the shifter circuit for carrying out an auto precharge operation.

Third Embodiment

Figure 14A:
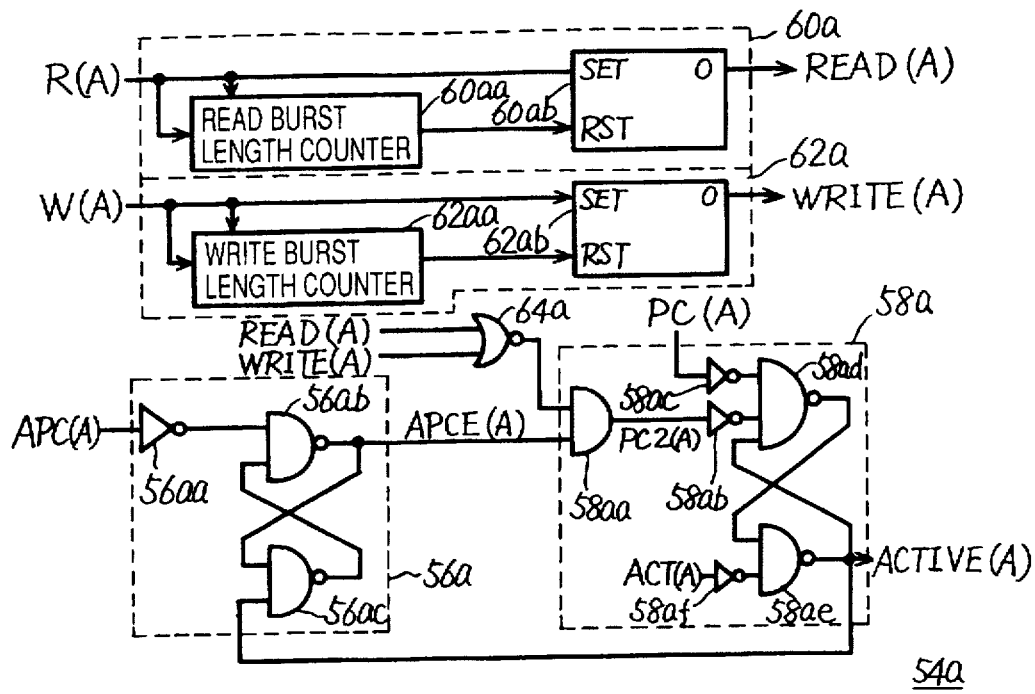
FIGS. 14A and 14B show structures of the control unit for banks #A and #B, respectively, of a synchronous semiconductor memory device according to a third embodiment of the present invention.
Figure 14B:
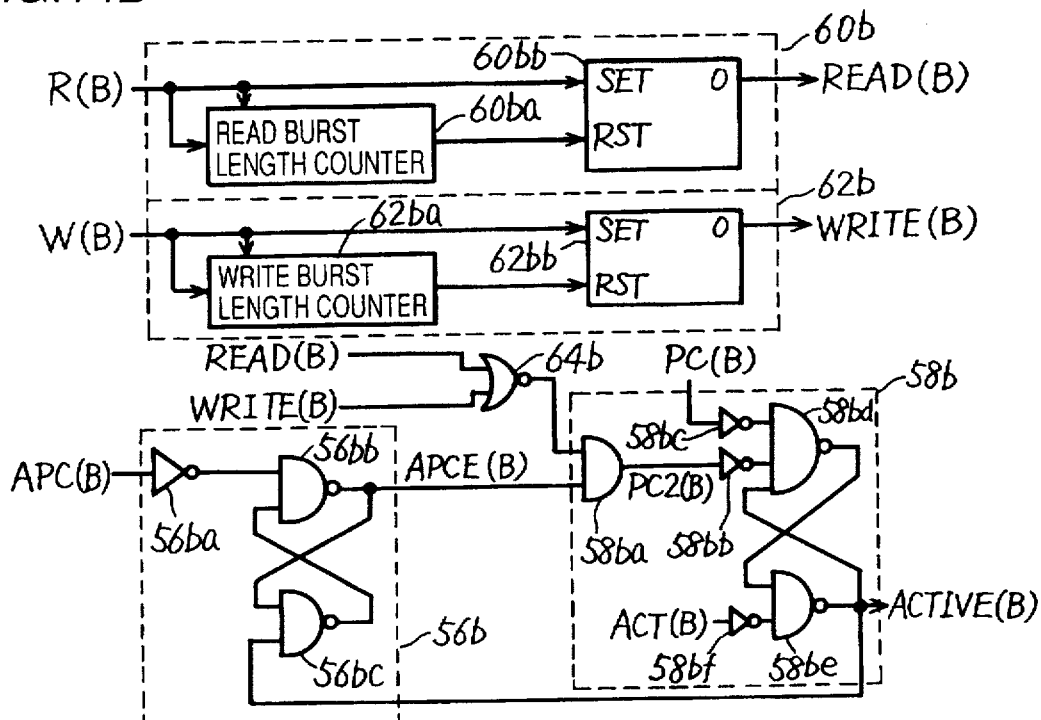

FIGS. 14A and 14B show the structure of an internal operation control portion for banks #A and #B, respectively, of a synchronous semiconductor memory device according to a third embodiment of the present invention.

Referring to FIG. 14A, control circuit 54a includes, in addition to flipflops 56a and 58a for generating internal operation activation signal ACTIVE(A), a read operation control circuit 60a for providing read operation activation signal READ(A) according to readout designating signal R(A) for bank #A, and a write control circuit 62a for providing write operation activation signal WRITE(A) according to write operation designating signal W(A).

Read control circuit 60a includes a read burst length counter 60aa reset to an initial value when read operation designating signal R(A) is activated to start counting a predetermined count value, and a flipflop 60ab set when read operation designating signal R(A) is activated and reset in response to a count up signal of read burst length counter 66aa. Read operation activation signal READ(A) is provided from flipflop 60ab. Read burst length counter 60aa counts the clock cycles of a preset burst length according to clock signal CLK.

Write control circuit 62a includes a write burst length counter 62aa reset to the initial value when write operation designating signal W(A) is activated, to start counting the burst length in a writing operation, and a flipflop 62ab set when write operation designating signal W(A) is activated and reset in response to a count up signal of write burst length counter 62aa. Write operation activation signal WRITE(A) is provided from flipflop 62ab. Read burst length counter 60aa and write burst length counter 62aa have a structure similar to that described with reference to FIG. 8A in the previous first embodiment.

Control circuit 54a further includes an NOR circuit 64a receiving read operation activation signal READ(A) and write operation activation signal WRITE(A). The output signal of NOR circuit 64a is applied to AND circuit 58aa in flipflop 58. More specifically, a signal attaining an H level at the inactivation of write and read operation activation signals is used instead of auto precharge command shift signal APCS in this structure. The structures of flipflops 56a and 58a are similar to those of the second embodiment 2 except that shift signal APCS is not used.

Referring to FIG. 14B, control circuit 54b includes, in addition to flipflops 56a and 58a for generating internal operation activation signal ACTIVE(B), a read operation control circuit 60b for providing read operation activation signal READ(B) according to read operation designating signal R(B) for bank #B, and a write operation control circuit 62b for generating write operation activation signal WRITE(B) for activating a data writing operation for bank #B according to write operation designating signal W(B) for bank #B.

Read operation control circuit 60b has a structure similar to that of read operation control circuit 60a for bank #A, and includes a read burst length counter 60ba and a flipflop 60bb. Similarly, write operation control circuit 62b has a structure similar to that of write operation control circuit 62a for bank #A and includes a write burst length counter 62ba and a flipflop 62bb. Control circuit 54b further includes an NOR circuit 64b receiving read operation activation signal READ(B) and write operation activation signal WRITE(B). The output signal of NOR circuit 64b is applied to AND circuit 58ba in flipflop 58b.

According to the structure of FIGS. 14A and 14B, a shift circuit for shifting an applied auto precharge command for a predetermined time period is not provided. Flipflop 58a (or 58b) can be reset by rendering auto precharge enable signal APCE(A) or APCE(B) active according to an already applied auto precharge command when a read operation and a write operation are completed in each bank. The structures shown in FIGS. 14A and 14B are substantially equal to the structure of the first embodiment provided for each of banks #A and #B. Therefore, in the case an auto precharge command is applied to bank #A, auto precharge enable signal APCE(A) that was active (auto precharge command is applied simultaneously to a write command or a read command is made valid) when a data writing operation and reading operation are completed to render read operation activation signal READ(A) and write operation activation signal WRITE(A) inactive and driving the output signal of NOR circuit 64a to an H level. Auto precharge operation trigger signal PC2(A) provided from AND circuit 58aa is rendered active, and internal operation activation signal ACTIVE(A) is rendered inactive. The same operation applies to bank #B.

In the structure shown in FIGS. 14A and 14B, a shifter circuit for rendering an auto precharge command valid at an elapse of a predetermined time period (delaying an auto precharge operation designating signal for a predetermined time period) is not required. The burst length counters required for data writing and data reading are used to establish an auto precharge operation commence timing. This eliminates the need of a dedicated shifter circuit for delaying an auto precharge command. Therefore, the layout area for the control circuitry can be reduced.

Fourth Embodiment

Figure 15:
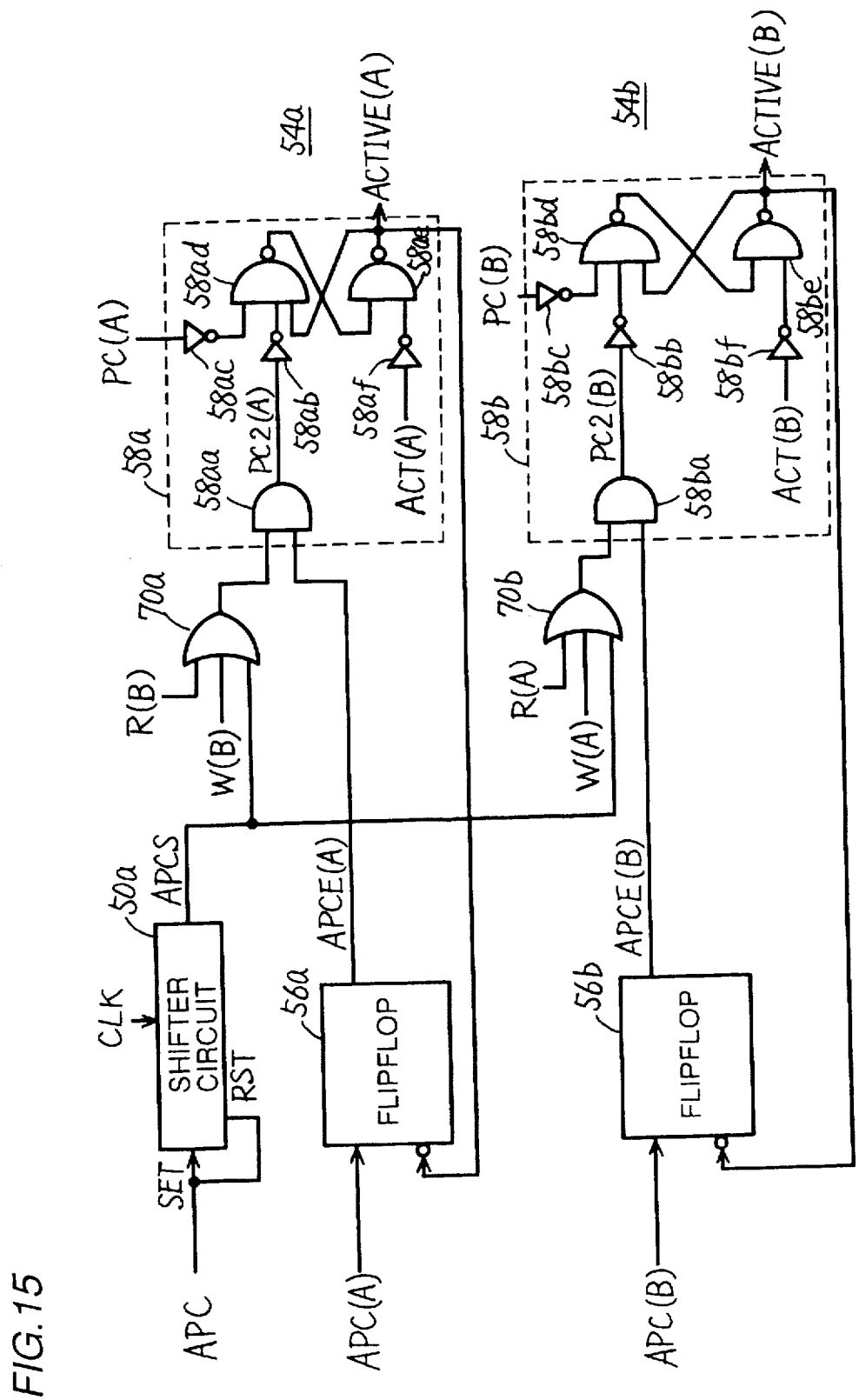
FIG. 15 shows a structure of a control unit of a synchronous semiconductor memory device according to a fourth embodiment of the present invention.

FIG. 15 schematically shows a structure of an internal operation activation signal generation portion of a synchronous semiconductor memory device according to a fourth embodiment of the present invention. Referring to FIG. 15, a shifter circuit 50a provided in common to banks #A and #B for delaying an auto precharge command responds to activation of auto precharge operation designating signal APC to be reset to the initial value for commencing a count operation. The structure shown in FIG. 8A can be applied for this shifter circuit 50a. In the structure of FIG. 15, the delay time provided by shifter circuit 50a (the number of shift clock cycles) is set independent of the preset burst length for data writing and reading.

Control circuit 54a for generating internal operation activation signal ACTIVE(A) for bank #A includes a flipflop 56a set in response to auto precharge operation designating signal ATC(A) for bank #A to output auto precharge enable signal APCE(A), and a flipflop 58a set in response to activation of internal operation activation commence designating signal ACT(A) for bank #A to render internal operation activation signal ACTIVE(A) active. Flipflop 56a is reset in response to inactivation of internal operation activation signal ACTIVE(A). The structures of flipflops 56a and 58a are similar to those shown in the second and third embodiments.

Control circuit 54a further includes an OR circuit 70a for receiving read operation designating signal R(B) for bank #B, write operation designating signal W(B) for bank #B, and auto precharge shift signal APCS from shifter circuit 50a. The output signal of OR circuit 70a is applied to AND circuit 58aa in flipflop 58a. More specifically, in control circuit 54a, auto precharge enable signal APCE(A) is rendered valid to set auto precharge operation trigger signal PC2(A) active when shift signal APCS from shifter circuit 50a or one of read operation designating signal R(B) and write operation designating signal W(B) for bank #B is activated.

Control circuit 54b includes a flipflop 56b set in response to activation of auto precharge operation designating signal APCE(B) for bank #B to render auto precharge enable signal APC(B) active, and a flipflop 58b set in response to activation of internal operation activation designating signal ACT(B) for bank #B to render internal operation activation signal ACTIVE(B) active. Flipflops 56b and 58b have a structure similar to that of control circuit 54b shown in the second and third embodiments.

Control circuit 54b further includes an OR circuit 70b for receiving read operation designating signal R(A) for bank #A, write operation designating signal W(A) for bank #A, and auto precharge operation shift signal APCS. The output signal of OR circuit 70b is applied to AND circuit 58ba in flipflop 58b. In control circuit 54b, when any of designating signal R(A), designating signal W(A) for #A, and shift signal APCS is set to an active state, auto precharge enable signal APCE(B) is rendered valid, and precharge operation trigger signal PC2(B) is rendered active. The operation of the control circuitry shown in FIG. 15 will be now described with reference to the timing chart of FIG. 16.

Figure 16:
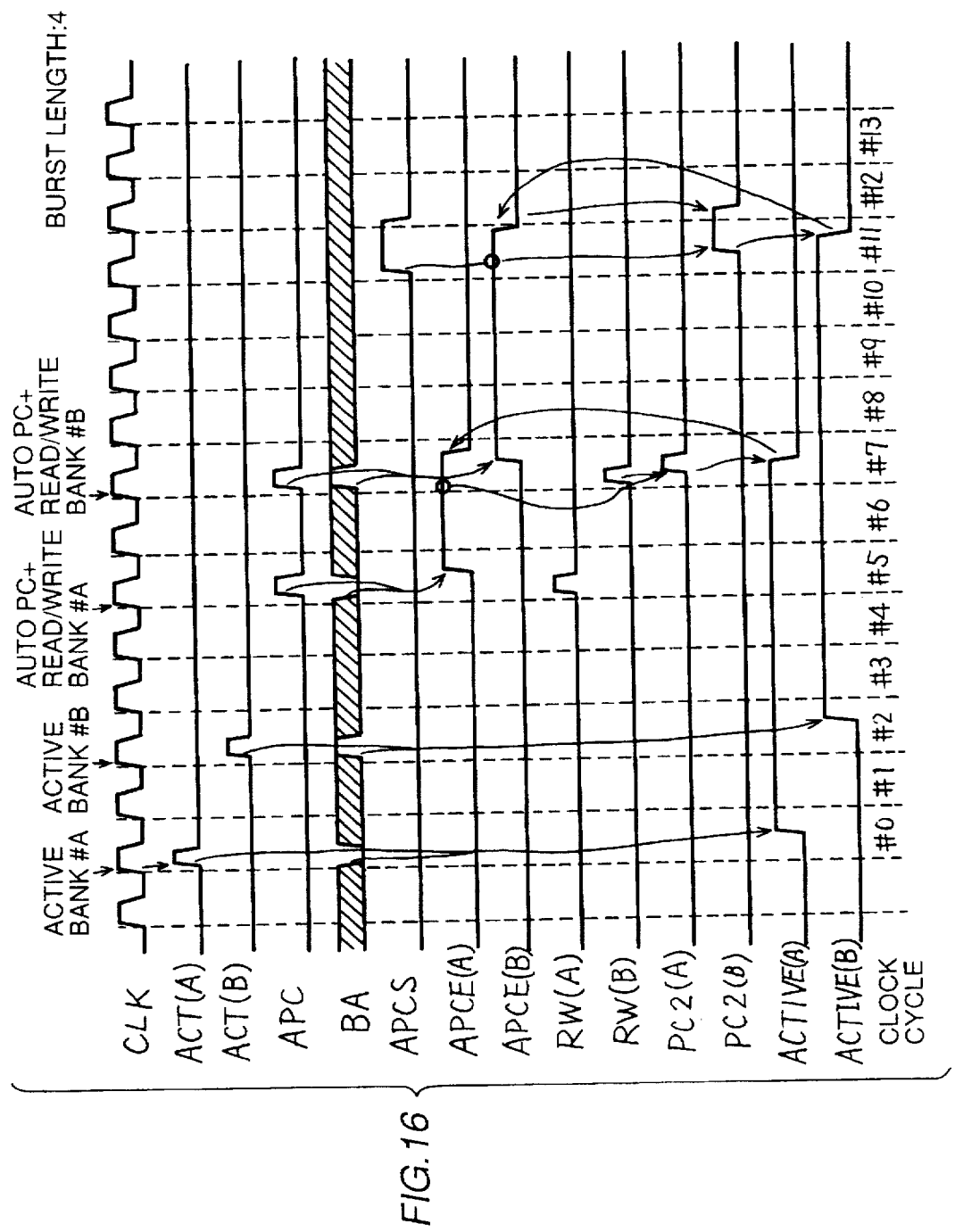
FIG. 16 is a timing chart representing an operation of the control unit shown in FIG. 15.

FIG. 16 shows an example where shifter circuit 50a shifts an applied auto precharge operation designating signal APC for 4 clock cycles with a burst length of 4.

At clock cycle #0, an active command is applied for bank #A, and internal operation commence designating signal ACT(A) is set to an H level of an active state. In response to activation of internal operation commence designating signal ACT(A), flipflop 54a is set to drive internal operation activation signal ACTIVE(A) to an H level of an active state. Then, a memory cell select operation is carried out in bank #A.

At clock cycle #2, an active command for bank #B is applied. Internal operation commence designating signal ACT(B) is driven to an H level of an active state. Flipflop 58b is set to drive internal operation activation signal ACTIVE(B) to an active state of an H level.

At clock cycle #5, an auto precharge command together with a read command or a write command (read/write command:access command) are applied for bank #A. In response, auto precharge operation designating signal APC is driven to an active state of an H level. Shifter circuit 50a is reset to the initial value and started to perform a shift operation. Here, flipflop 56a is set to drive auto precharge enable signal APCE(A) to an H level. Data read designating signal R(A) or data write designating signal W(A) are driven to an H level of an active state according to an access command (both signals are labeled signal RW(A) in FIG. 16). An access operation is carried out in bank #A according to this access command.

At clock cycle #7 prior to an elapse of the burst length, an auto precharge command together with an access command for bank #B are applied. According to activation of auto precharge operation designating signal APC in clock cycle #7, shifter circuit 50a is reset to the initial value to commence a shift operation. Auto precharge enable signal APCE (A) from flipflop 56a attains an H level of an active state. Therefore, according to the access command for bank #B in clock cycle #7, the output signal of OR circuit 70a is driven to an H level, auto precharge trigger signal PC2(A) from AND circuit 58aa in flipflop 58a is driven to an active state of an H level, and internal operation activation signal ACTIVE(A) is driven to an L level of inactive state. According to inactivation of internal operation activation signal ACTIVE(A), flipflop 56a is reset, and auto precharge enable signal APCE(A) is reset to an L level. Thus, bank #A returns to a precharge state.

In bank #B, a data access operation is effected according to the access command applied in clock cycle #7. At an elapse of the burst length, auto precharge shift signal APCS from shifter circuit 50a is pulled up to an H level at clock cycle #11, and the output signal of OR circuit 70b attains an H level. Flipflop 56b is set in accordance with the auto precharge command of clock cycle #7, and auto precharge enable signal APCE(B) attains an H level. Therefore, at clock cycle #11, auto precharge operation trigger signal PC2(B) from AND circuit 58ba is set to an active state of an H level, and internal operation activation signal ACTIVE(B) is set to an inactive state of an L level. In response to an inactivation of internal operation activation signal ACTIVE (B), flipflop 56b is reset, and auto precharge enable signal APCE(B) is reset to an L level of an inactive state.

When bank #B is to be accessed prior to an elapse of the burst length during access to bank #A, bank #A can be precharged in accordance with the access command to bank #B. Therefore, required data can be properly read out from banks #A and #B. Access to bank B is effected only when bank A attains a precharge state or when access to bank #A is completed. Therefore, all the required data can be read out even if bank #A returns to a precharge state according to the access command for bank #B, as described above.

When the access to banks #A and #B is carried out at the interval of the burst length, an operation similar to that described in the second embodiment is implemented. When an access command is applied at an interval greater than the burst length, inactivation of internal operation activation signal ACTIVE(A) or ACTIVE(B) is effected according to shift signal APCS in respective banks #A and #B.

By effecting control of the internal operation activation signal generation circuitry of one bank in accordance with the active/inactive state of the access command to the other bank, required data can be read out properly even in the case of an access interrupt (access command is applied at an interval shorter than the burst length). In the case where an interrupt operation is effected successively in bank #A, the internal operation can be maintained at an active state to access the required data since shifter circuit 50a is reset at every application of an auto precharge command by continuously applying an auto precharge command.

According to the present fourth embodiment in which a shifter circuit is shared by a plurality of banks, even when another bank is accessed at an interval shorter than the burst length, each bank can be precharged at a required timing by adding a structure for controlling the active/inactive state of the internal operation of a bank using the access command of another bank.

Fifth Embodiment

Figure 17:
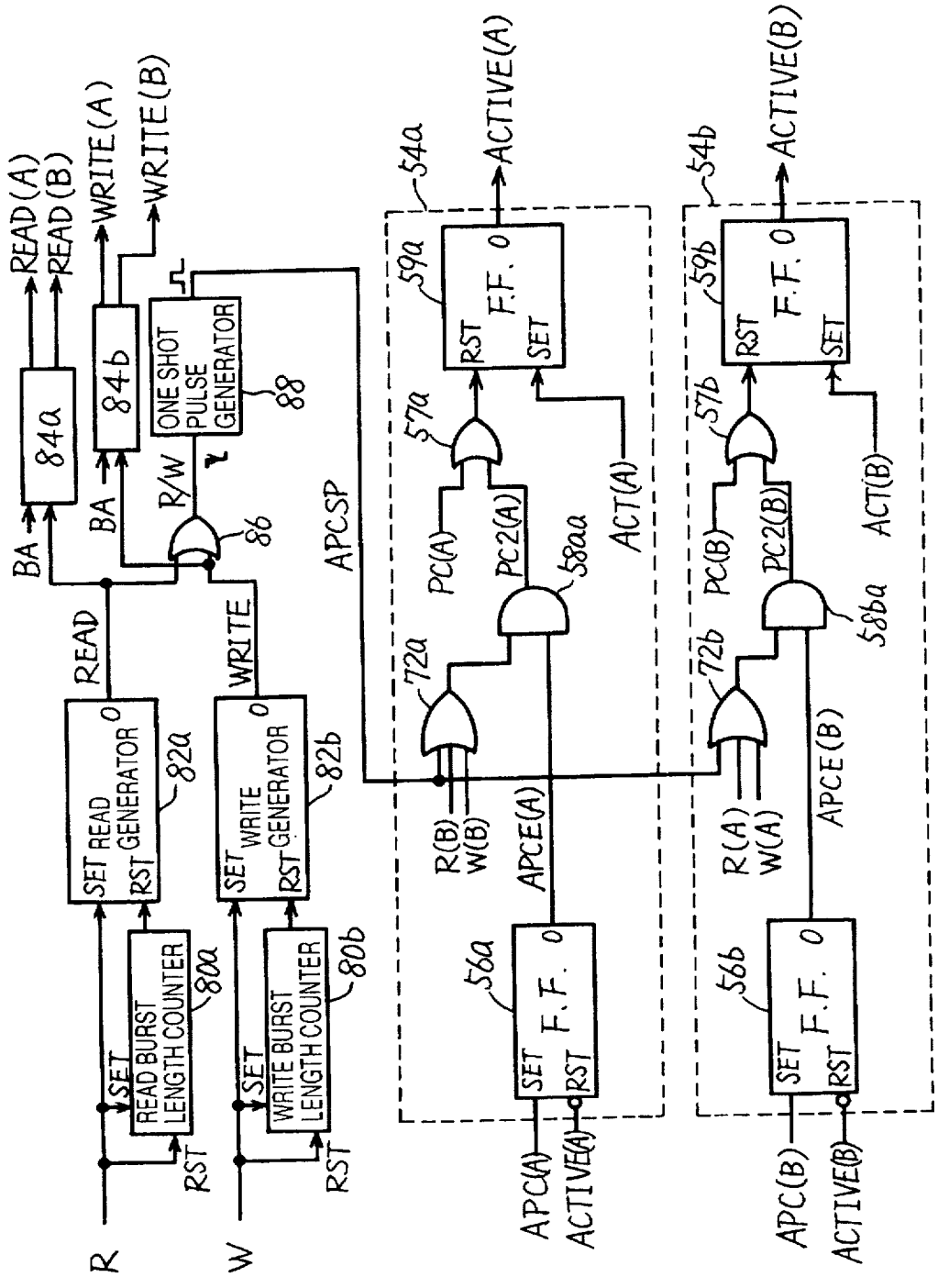
FIG. 17 shows a structure of a control unit according to a synchronous semiconductor memory device according a fifth embodiment of the present invention.

FIG. 17 schematically shows a structure of the control circuitry of a synchronous semiconductor memory device according to a fifth embodiment of the present invention. Referring to FIG. 17, the synchronous semiconductor memory device includes a read burst length counter 80a reset to an initial value in response to activation of read operation designating signal R to commence a count operation, a read generator 82a set when read operation designating signal R is activated to render read operation activation signal READ active, and reset in response to a count up signal from read burst length counter 80a for rendering read operation activation signal READ inactive, a write burst length counter 80b reset to an initial value, when write operation designating signal W is activated, to commence a count operation, a write generator 82b set when write operation designating signal W is activated, to render write operation activation signal WRITE active and reset in response to a count up signal from burst length counter 80b to set write operation activation signal WRITE inactive, an OR circuit 86 for receiving read operation activation signal READ from read generator 82a and write operation activation signal WRITE from write generator 82b, and a one shot pulse generator 88 responsive to a fall of output signal R/W of OR circuit 86 for generating a one shot pulse signal of an H level.

Read burst length counter 80a, read generator 82a, read burst length counter 80b and write generator 82b have structures similar to those described with reference in the first embodiment. Read burst length counter 80a, read generator 82a, write burst length counter 80b and write generator 82b are provided in common to banks #A and #B.

The synchronous semiconductor memory device further includes a read select circuit 84a for receiving read operation activation signal READ from read generator 82a and bank address signal BA for providing read operation activation signals READ(A) and READ(B) for banks #A and #B, and a write select circuit 84b for providing write operation activation signals WRITE(A) and WRITE(B) for banks #A and #B according to write operation activation signal WRITE and bank address signal BA. The write/read operation activation signal is rendered active only for the bank specified by bank address signal BA.

The synchronous semiconductor memory device further includes a control circuit 54a rendered active in response to internal operation activation commence designating signal ACT(A) for bank #A to provide internal operation activation signal ACTIVE(A), and a control circuit 54b rendered active in response to internal operation activation commence designating signal ACT(B) for bank #B to provide internal operation activation signal ACTIVE(B).

Control circuit 54a includes a flipflop 56a set at activation of auto precharge operation designating signal APC(A) and reset at inactivation of internal operation activation signal ACTIVE(A), an OR circuit 72a receiving pulse signal APCSP from one shot pulse generator 88, read operation designating signal R(B) for bank #B, and write operation designating signal W(B) for bank #B, an AND circuit 58aa for receiving auto precharge enable signal APCE(A) from flipflop 56a and an output signal of OR circuit 72a, an OR circuit 57a for receiving precharge operation designating signal PC(A), and auto precharge operation trigger signal PC2(A) from AND circuit 58aa, and a flipflop 59a set at activation of internal operation activation commence designating signal ACT(A) and reset at activation (H level) of an output signal of OR circuit 57a. Internal operation activation signal ACTIVE(A) is provided from flipflop 59a.

Control circuit 54b includes a flipflop 56b set at activation of auto precharge operation designating signal APC(B), and reset in response to inactivation of internal operation activation signal ACTIVE(B), an OR circuit 72b for receiving pulse signal APCSP, read operation designating signal R(A) for bank #A, and write operation designating signal W(A) for bank #A, an AND circuit 58ba for receiving an output signal of OR circuit 72b and auto precharge enable signal APCE(B) from flipflop 56b, an OR circuit 57b for receiving precharge operation designating signal PC(B) and an output signal of AND circuit 58ba, and a flipflop 59b set at activation of internal operation activation signal ACT(B) and reset at activation (H level) of the output signal of OR circuit 57b. Internal operation activation signal ACTIVE(B) from flipflop 59b is output.

Figure 18:
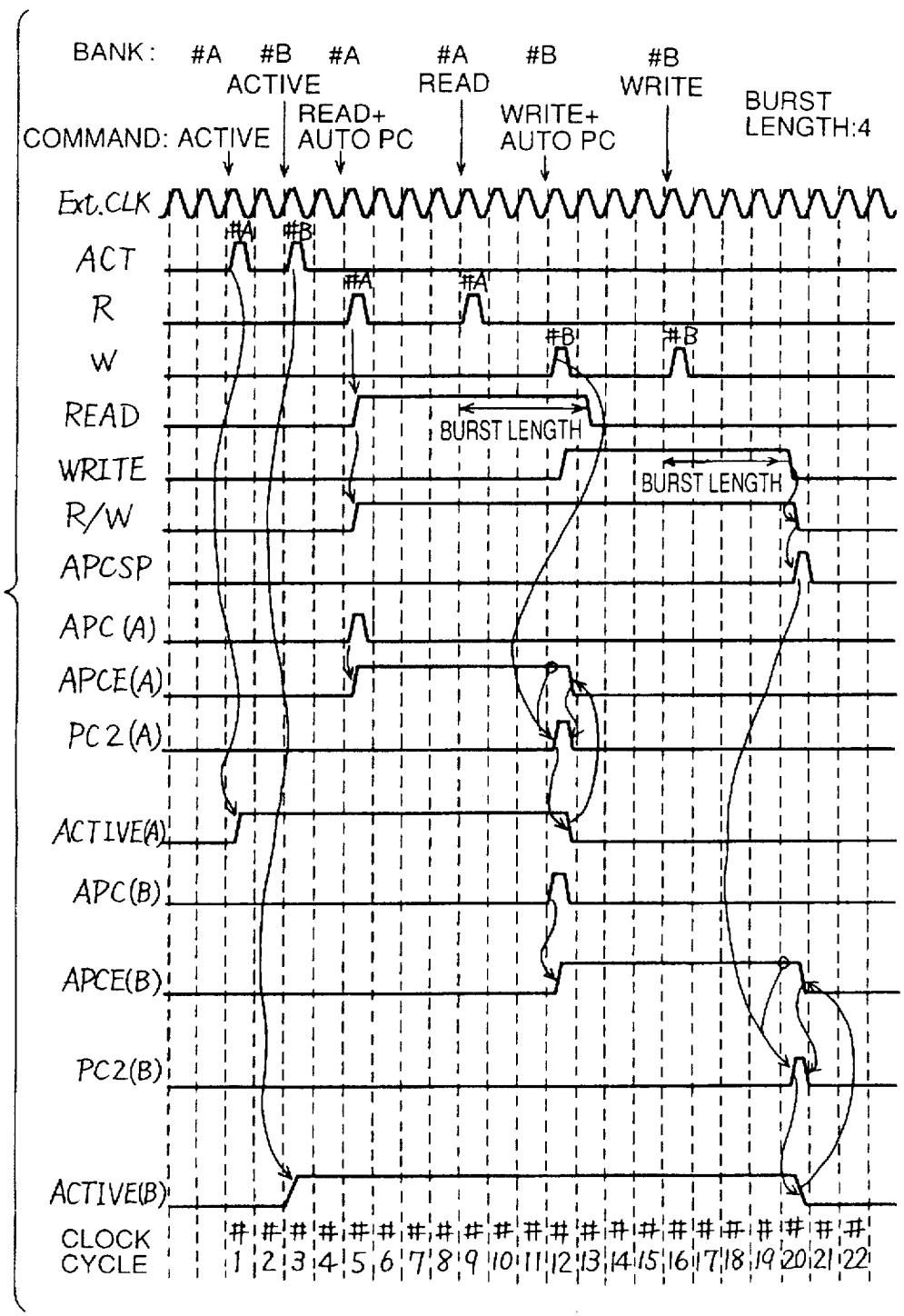
FIG. 18 is a timing chart representing an operation of the control unit of FIG. 17.

According to the structure shown in FIG. 17, a read burst length counter and a write burst length counter are employed instead of the shifter circuit for shifting auto precharge operation designating signal APC of the fourth embodiment. A signal equivalent to auto precharge shift signal APCS is provided from one shot pulse generator 88. The operation of the control circuitry of the synchronous semiconductor memory device of the fifth embodiment will be described hereinafter with reference to the timing chart of FIG. 18. In FIG. 18, an operation with a burst length of 4 is shown.

At clock cycle #1, an active command is applied for bank #A. In response, flipflop 59a is set to render internal operation activation signal ACTIVE(A) to an active state of an H level.

At clock cycle #3, an active command is applied for bank #B. Flipflop 59b is set, and internal operation activation signal ACTIVE(B) is set to an active state of an H level.

At clock cycle #5, a read command and an auto precharge command (auto PC) are applied for bank #A. In response to the read command, read operation designating signal R is driven to an active state of an H level. Read burst length counter 80a commences a count operation. Similarly, read generator 82a is set, and read operation activation signal READ is driven to an active state of an H level. According to the auto precharge command for bank #A, auto precharge operation designating signal APC(A) attains an H level for a predetermined time period.

Flipflop 56a is set, and auto precharge enable signal APCE(A) is set to an H level of an active state. According to the read command, data readout of a memory cell is carried out in bank #A.

At clock cycle #9 corresponding to an elapse of four clock cycles of the burst length, a read command is applied again for bank #A. According to this read command, read operation designating signal R is rendered active again. Read burst length counter 80a is reset to commence again a count operation. Also, read generator 82a is set, and read operation activation signal READ is set to an active state of an H level continuously. Thus, data readout is carried out in bank #A again.

At clock cycle #12, a write command and an auto precharge command are applied for bank #B. According to this write command, write operation designating signal W is rendered active. In response, write burst length counter 80b is started to perform a count operation. Also, write generator 82b is set to render internal write operation activation signal WRITE active of an H level. According to the write command for bank #B in clock cycle #12, write operation designating signal W(B) for bank #B is set to an active state of an H level, and the output signal of OR circuit 72a is driven to an H level. Auto precharge enable signal APCE(A) from flipflop 56a attains an H level during this clock cycle #12. Therefore, auto precharge operation trigger signal PC2(A) from AND circuit 58aa is rendered active. In response, flipflop 59a is reset via OR circuit 57a and internal operation activation signal ACTIVE(A) is rendered inactive. In response to inactivation of internal operation activation signal ACTIVE(A), bank #A is set to a precharge state. Also, flipflop 56a is reset, and enable signal APCE(A) is set to an inactive state of an L level.

In this clock cycle #12, auto precharge operation designating signal APC(B) for bank #B is generated, whereby flipflop 56b is set. Auto precharge enable signal APCE(B) is set to an active state of an H level.

Although read operation activation signal READ attains an H level in this clock cycle #12, bank #A can be set to a precharge state to read out the required data properly since an access operation is effected for bank #B prior to the data readout for the burst length of bank #A. In the case where an auto precharge command is previously provided at clock cycle #5, the burst length counter is reset to maintain read operation activation signal READ at an active state by applying the next read command or write command within the burst length period, similar to the first embodiment. Therefore, the same bank can be accessed continuously in a page mode operation.

At clock cycle #13, a count up signal from read burst length counter 80a is provided, and read operation activation signal READ from read generator 82a is set to an inactive state. Although write operation activation signal WRITE is set to an active state at clock cycle #12 and read operation activation signal READ is set to inactive state at clock cycle #13, a mask is applied with respect to the readout data by a mask signal at clock cycle #13 so as to give priority to a data write operation (writing data into a memory cell). Therefore, there is no internal conflict between data.

Following data writing of a burst length after write command is applied at clock cycle #12, a write command is applied again for bank #B at clock cycle #16. According to this write command, write burst length counter 80b is reset again to initiate a count operation, and data writing for bank #B is executed (by select circuit 84b, write operation activation signal WRITE(B) is rendered active). Even if an auto precharge command is used during this data writing, internal precharge operation will be inhibited since the burst length counter is reset by applying an access command within the burst length interval. Therefore, access can be effected continuously according to the page mode operation with respect to the same bank.

Write burst length counter 80b provides a count up signal at clock cycle #20 when clock cycles of the burst length is counted. Write generator 82b is reset, and write operation activation signal WRITE is rendered inactive. In response to inactivation of write operation activation signal WRITE, signal R/W from OR circuit 86 is driven to an L level, and pulse signal APCSP from one shot pulse generator 88 is driven to an H level. According to pulse signal APCSP rendered active, the output signal of OR circuit 72b is set to an H level, and auto precharge enable signal APCE(B) is set to an active state of an H level. Therefore, flipflop 59b is reset via AND circuit 58ba and OR circuit 57b, and internal operation activation signal ACTIVE(B) is reset. Therefore, the internal memory cell array bank can be returned to a precharge state reliably after completion of data writing/ reading in a page mode even in the case of a page mode operation with an applied auto precharge command.

According to the fifth embodiment, the auto precharge command is delayed using a burst length counter. Burst length counters 80a and 80b are provided in common to banks #A and #B. It is therefore not necessary to provide a shifter circuit for delaying an auto precharge command for a predetermined time period. Furthermore, the layout area of the control circuitry can be reduced significantly due to the common provision for the banks. Furthermore, in the case where read operation activation signals READ and WRITE are both inactive, pulse signal APCSP corresponding to an auto precharge signal is provided to render auto precharge enable signal APCE to a valid state (AND circuits 58aa and 58ba enabled). Therefore, the memory cell array (bank) can be set internally to a precharge state at completion of a page mode operation even when an auto precharge command is applied previously.

Since the auto precharge enable signal is rendered valid according to access operation designating signals (R(A), R(B), W(A), W(B)) for another bank, each bank can return to a precharge state when required.

Although two banks are employed in the above described embodiments, a similar effect can be achieved even for three or more banks. When three or more banks are provided, a structure is implemented in which a read operation designating signal and a write operation designating signal for all the other banks are applied to the OR circuit for rendering the auto precharge enable signal valid in the control circuit. The structure of the fourth or fifth embodiment can be applied for the remaining structure.

The burst length is not limited to the value of 4, and is arbitrary.

According to the present invention, a synchronous semiconductor memory device can be implemented which is reduced in layout area, and improved in control for an auto precharge command.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device comprising:

internal activation signal generation means responsive to an externally applied memory cell select operation commence designating signal in synchronization with a clock signal applied externally and periodically, for rendering active an internal operation activation signal for activating a memory cell select operation, access operation activation signal generation means responsive to an externally applied access designating signal in synchronization with the clock signal, for rendering an internal access operation activation signal for activating an access operation, precharge activation signal generation means responsive to a precharge designating signal applied simultaneously with said access designating signal, for rendering active an internal precharge activation signal for deactivating the memory cell select operation, and internal operation inactivation means coupled to said internal activation signal generation means, said access operation activation signal generation means and said precharge activation signal generation means and responsive to inactivation of said access operation activation signal and the activated internal precharge activation signal for rendering said internal operation activation signal inactive.

2. The synchronous semiconductor memory device according to claim 1, wherein said access designating signal comprises a data write designating signal for designating data writing, and a data read designating signal for designating data readout, and said internal access operation activation signal comprises an internal data write operation activation signal activated, when said data write designating signal is activated, for activating an internal data write operation, and an internal data read operation activation signal activated, when said data read designating signal is activated, for activating an internal data readout operation, wherein said access operation activation signal generation means comprises first count means responsive to activation of said data read designating signal to be reset to an initial value and started for counting said clock signal for a first predetermined value, read operation activation means for activating said data read operation activation signal in response to activation of said data read designating signal, and inactivating said data read operation activation signal in response to a count up signal from said first count means, second count means responsive to activation of said data write designating signal to be reset to an initial value and started for counting said clock signal for a second predetermined value, write operation activation means for activating said data write operation activation signal in response to activation of said data write designating signal, and for inactivating said data write operation activation signal in response to a count up signal from said second count means, a logic gate receiving said data read operation activation signal and said data write operation activation signal for generating a signal attaining an inactive state when both said data readout operation activation signal and said data write operation activation signal are inactive, and inactivation means responsive to inactivation of an output signal of said logic gate for rendering said internal activation signal generation means inactive and said internal operation activation signal inactive.

3. The synchronous semiconductor memory device according to claim 2, wherein said first count means comprises a read burst length counter for counting a number of cycles of said clock signal corresponding to the number of data that can be read out continuously in synchronization with said clock signal in response to application of said data read out operation designating signal, and wherein said second count means comprises a write burst length counter for counting a number of cycles ofsaid clock signals corresponding to a number of data that can be continuously written in synchronization with said clock signal in response to application of said data write designating signal.

4. A synchronous semiconductor memory device comprising:

a plurality of banks, each including a plurality of memory cells, and driven to an active state independently of each other, internal operation designating means responsive to a memory cell select operation commence designating signal and a first bank address signal specifying a bank out of said plurality of banks externally applied in synchronization with a clock signal externally applied periodically and repeatedly, for activating an internal operation designating signal instructing a memory cell select operation for the bank specified by said first bank address signal, internal access activation means responsive to an access designating signal and a second bank address signal externally applied in synchronization with said clock signal, for rendering active an internal access operation activating signal that activates an internal access operation for a bank specified by said second bank address signal, precharge designating means responsive to a precharge designating signal applied simultaneously with said access designating signal for rendering active an internal precharge designating signal instructing deactivation of the memory cell select operation for the bank specified by said second bank address signal, a plurality of internal operation activation means provided corresponding to each of said plurality of banks, responsive to an internal operation designating signal received from said internal operation designating means for rendering active an internal operation activation signal to set a corresponding bank to said active state, and precharge means provided corresponding to each of said plurality of banks, each receiving a corresponding precharge designating signal from said precharge designating means, and a corresponding internal operation activation signal and an internal access operation activation signal for another bank from said internal access activation means, for inactivating said internal operation activation signal for a corresponding bank in response to one of activation of said internal access operation activation signal for another bank and inactivation of each said internal access operation activation signal, and activation of said precharge designating signal.

5. The synchronous semiconductor memory device according to claim 4, wherein said access designating signal comprises a data write designating signal for designating data writing, a data read designating signal for designating data read out, and said internal access operation activation signal includes a data write operation trigger signal activated when said data write designating signal is activated, an internal data write operation activation signal rendered active for a predetermined time period when said data write operation trigger signal is activated, an internal data read operation trigger signal activated when said data read designating signal is activated, and an internal data read operation activation signal rendered active when said internal data read operation trigger signal is activated, wherein said internal access activation means comprises first count means responsive to activation of said internal data read operation trigger signal to be reset to an initial value and started for counting said clock signal for a first predetermined value, read operation activation means for activating said internal data read operation activation signal in response to activation of said internal data read operation trigger signal, and for inactivating said internal data read operation activation signal in response to a count up signal from said first count means, second count means responsive to activation of said data write operation trigger signal to be reset to an initial value and started for counting said clock signal for a second predetermined value, write operation activation means for activating said internal data write operation activation signal in response to activation of said data write operation trigger signal, and rendering inactive said internal data write operation activation signal in response to a count up signal from said second count means, a logic gate receiving said internal data read operation activation signal and said internal data write operation activation signal for generating a signal attaining an inactive state when said internal data read operation activation signal and said internal data write operation activation signal are both inactive, and means responsive to inactivation of an output signal of said logic gate for providing a signal indicating inactivation of said internal operation activation signal to said precharge means.

6. The synchronous semiconductor memory device according to claim 5, wherein said first count means comprises a read burst length counter for counting a number of cycles of said clock signal corresponding to a number of data that can be successively read out in synchronization with said clock signal in response to application of said data read designating signal, and wherein said second count means comprises a write burst length counter responsive to application of said data write designating signal for counting a number of cycles of said clock signal corresponding to a number of data that can be written successively in synchronization with said clock signal.

7. The synchronous semiconductor memory device according to claim 4, wherein said internal access activation means comprises main means provided in common to said plurality of banks, responsive to said access designating signal for activating a main internal access activation signal for a predetermined time period, means provided corresponding to each of said plurality of banks, for rendering active said internal access operation activation signal for a corresponding bank in accordance with said second bank address signal externally applied and said main internal access activation signal received from said main means, and means coupled to said main means, for detecting inactivation of said main internal access activation signal and applying the inactivation detection signal to said precharge means of each of said plurality of banks.

8. The synchronous semiconductor memory device according to claim 7, wherein said main means comprises a burst length counter activated when said access designating signal is activated for counting a number of cycles of said clock signal corresponding to a burst length indicating a number of data that can be accessed successively.

9. The synchronous semiconductor memory device according to claim 4, further comprising shifter means coupled to receive said precharge designating signal and responsive to the received precharge designating signal for counting said clock signal to generate a count up signal as a detection signal indicating the inactivation of each said internal access operation activation signal when the count reaches a predetermined number, said shifter means being reset to an initial state at each application of said precharge designation signal to resume a count operation, and the count up signal being applied to each said precharge means.

10. The synchronous semiconductor memory device according to claim 1, further comprising a plurality of banks driven to a selected state independently of each other and including a plurality of memory cells, and bank designation means responsive to a bank address externally applied in synchronization with said clock signal for generating a bank designation signal specifying a bank, and wherein a set of said internal activation signal generation means, said access operation activation signal generation means, precharge activation signal generation means and internal operation inactivation means is provided for each of said plurality of banks, a set provided for a bank specified by said bank designation signal being operated.

11. The synchronous semiconductor memory device according to claim 10, further comprising shifter means provided in common to said plurality of banks, for counting said clock signal in response to application of said precharge designating signal to generate a detection signal indicating the inactivation of the internal access operation activation signal in each the bank for application to said precharge means provided for each the bank when the count reaches a predetermined number.

* * * * *

US005748560C1

(12) EX PARTE REEXAMINATION CERTIFICATE (9448th)
United States Patent
Sawada

(10) Number: US 5,748,560 C1
(45) Certificate Issued: Dec. 19, 2012

(54) SYNCHRONOUS SEMICONDUCTOR MEMORY DEVICE WITH AUTO PRECHARGE OPERATION EASILY CONTROLLED

(75) Inventor: Seiji Sawada, Hyogo (JP)

(73) Assignee: DRAM Memory Technologies LLC, Newport Beach, CA (US)

Reexamination Request:
No. 90/012,147, Feb. 16, 2012

Reexamination Certificate for:
Patent No.: 5,748,560
Issued: May 5, 1998
Appl. No.: 08/740,175
Filed: Oct. 28, 1996

(30) Foreign Application Priority Data

Dec. 25, 1995 (JP) .................................. 7-336783

(51) Int. Cl.
*G11C 7/10* (2006.01)
(52) U.S. Cl. ......... 365/230.03; 365/189.08; 365/189.12; 365/230.06; 365/233.14; 365/233.19

(58) Field of Classification Search ................... None
See application file for complete search history.

(56) References Cited

To view the complete listing of prior art documents cited during the proceeding for Reexamination Control Number 90/012,147, please refer to the USPTO's public Patent Application Information Retrieval (PAIR) system under the Display References tab.

*Primary Examiner* — Linh M. Nguyen

(57) ABSTRACT

An internal read/write termination detect circuit generates a one shot pulse signal when a read operation activation signal and a write operation activation signal are both set to an inactive state. An internal operation activation signal generation circuit holds an auto precharge enable signal by a flipflop according to an auto precharge command to generate a precharge operation trigger signal according to the auto precharge enable signal and the one shot pulse signal. An internal operation activation signal is reset to an inactive state. The auto precharge command is made valid to carry out an internal precharge operation only when internal write/read operation is completed. A synchronous semiconductor memory device with easy control of an auto precharge command and reduced in layout area is provided.

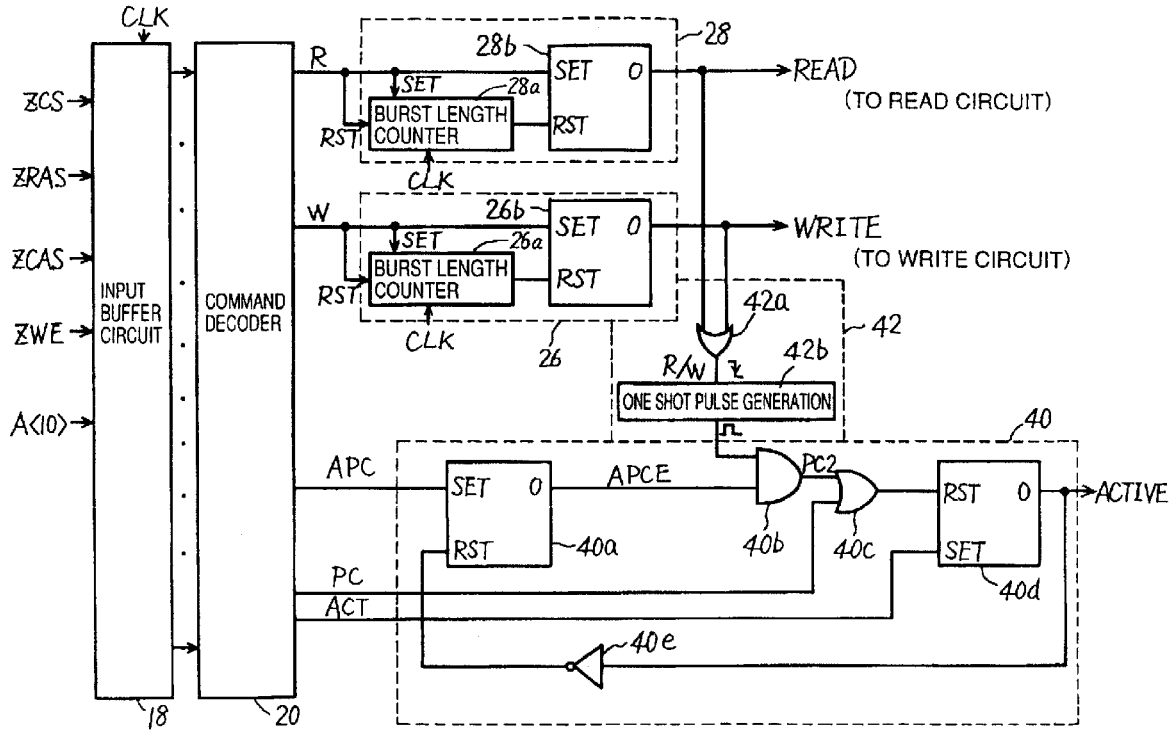

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-11 is confirmed.

* * * * *